(12) United States Patent
Koch et al.

(10) Patent No.: US 12,046,871 B2
(45) Date of Patent: Jul. 23, 2024

(54) SYSTEM COMPRISING AN INTEGRATED WAVEGUIDE-COUPLED OPTICALLY ACTIVE DEVICE AND METHOD OF FORMATION

(71) Applicant: Quintessent Inc., Goleta, CA (US)

(72) Inventors: Brian Koch, Santa Barbara, CA (US); Michael Davenport, Santa Barbara, CA (US); Alan Liu, Santa Barbara, CA (US); Justin Colby Norman, Goleta, CA (US)

(73) Assignee: Quintessent Inc., Goleta, CA (US)

( * ) Notice: Subject to any disclaimer, the term of this patent is extended or adjusted under 35 U.S.C. 154(b) by 0 days.

(21) Appl. No.: 18/073,458

(22) Filed: Dec. 1, 2022

(65) Prior Publication Data

US 2023/0109277 A1    Apr. 6, 2023

Related U.S. Application Data

(63) Continuation of application No. 17/484,370, filed on Sep. 24, 2021, now Pat. No. 11,631,967, which is a
(Continued)

(51) Int. Cl.
  *G02B 6/12* (2006.01)
  *G02B 6/122* (2006.01)
  (Continued)

(52) U.S. Cl.
  CPC ............ *H01S 5/1014* (2013.01); *H01S 5/209* (2013.01); *H01S 5/34* (2013.01); *G02B 6/12004* (2013.01); *G02B 6/1228* (2013.01)

(58) Field of Classification Search
  CPC .......................... G02B 6/12004; G02B 6/1228
  See application file for complete search history.

(56) References Cited

U.S. PATENT DOCUMENTS 3,978,426 A   8/1976  Logan et al.
4,354,898 A * 10/1982  Coldren ............ H01L 21/30617
                                              438/43
(Continued)

FOREIGN PATENT DOCUMENTS

CN      107561640 A    1/2018
EP       0763767 A1    3/1997
(Continued)

OTHER PUBLICATIONS

English translation of EP2544319 A1 (Year: 2013).
(Continued)

*Primary Examiner* — Charlie Y Peng
(74) *Attorney, Agent, or Firm* — Kaplan Breyer Schwarz, LLP

(57) ABSTRACT

Integrated-optics systems are presented in which an optically active device is optically coupled with a silicon waveguide via a passive compound-semiconductor waveguide. In a first region, the passive waveguide and the optically active device collectively define a composite waveguide structure, where the optically active device functions as the central ridge portion of a rib-waveguide structure. The optically active device is configured to control the vertical position of an optical mode in the composite waveguide along its length such that the optical mode is optically coupled into the passive waveguide with low loss. The passive waveguide and the silicon waveguide collectively define a vertical coupler in a second region, where the passive and silicon waveguides are configured to control the distribution of the optical mode along the length of the coupler, thereby enabling the entire mode to transition between the passive and silicon waveguides with low loss.

41 Claims, 13 Drawing Sheets sectional view through f-f

Related U.S. Application Data continuation-in-part of application No. 16/746,400, filed on Jan. 17, 2020, now Pat. No. 11,131,806.

(60) Provisional application No. 62/961,348, filed on Jan. 15, 2020.

(51) Int. Cl.
- *H01S 5/10* (2021.01)
- *H01S 5/20* (2006.01)
- *H01S 5/34* (2006.01)

(56) References Cited

U.S. PATENT DOCUMENTS

| | | |
|---|---|---|
| 6,411,764 B1 | 6/2002 | Lee |
| 8,380,033 B1 | 2/2013 | Fang et al. |
| 8,620,164 B2 | 12/2013 | Heck et al. |
| 8,767,792 B2 | 7/2014 | Bowers et al. |
| 9,097,848 B2 | 8/2015 | Bowers |
| 9,285,540 B2 | 3/2016 | Bauters et al. |
| 9,910,220 B2 | 3/2018 | Bowers |
| 10,444,433 B1 | 10/2019 | Bian et al. |
| 10,447,006 B2 * | 10/2019 | Abel ............... H01S 5/04256 |
| 11,131,806 B2 | 9/2021 | Koch et al. |
| 11,150,406 B2 | 10/2021 | Koch et al. |
| 2003/0086654 A1 | 5/2003 | Saini et al. |
| 2004/0052480 A1 | 3/2004 | Benzoni et al. |
| 2006/0285797 A1 | 12/2006 | Little |
| 2011/0299561 A1 | 12/2011 | Akiyama |
| 2015/0146755 A1 | 5/2015 | Kim et al. |
| 2015/0226918 A1 | 8/2015 | Bauters et al. |
| 2016/0131842 A1 | 5/2016 | Mahgerefteh et al. |
| 2017/0023734 A1 | 1/2017 | Chiu et al. |
| 2017/0098922 A1 * | 4/2017 | Hatori ............... H04B 10/501 |
| 2019/0146154 A1 * | 5/2019 | Carothers ........... H01L 31/1856 257/213 |
| 2020/0174194 A1 | 6/2020 | Kojima et al. |
| 2020/0313397 A1 | 10/2020 | Jung et al. |
| 2022/0003929 A1 | 1/2022 | Koch et al. |
| 2022/0013985 A1 | 1/2022 | Koch et al. |

FOREIGN PATENT DOCUMENTS

| | | |
|---|---|---|
| EP | 2544319 A1 | 1/2013 |
| FR | 2909491 A1 | 6/2008 |

OTHER PUBLICATIONS

English translation of FR 2909491 A1 (Year: 2008).

G. Allen Vawter et al., "Tapered Rib Adiabatic Following Fiber Couplers in Etched GaAs Materials for Monolithic Spot-Size Transformation", "IEEE Journal of Selected Topics in Quantum Electronics", Dec. 1, 1997, pp. 1361-1371, vol. 3, No. 6.

Michael Davenport et al., Unpublished U.S. Appl. No. 17/465,403, filed Sep. 2, 2021, "Windowed Sampled Grating and Method of Fabrication", 50 pp.

Non-Final Office Action Mailed on Jun. 30, 2021 for U.S. Appl. No. 16/746,565.

Non-Final Office Action received for U.S. Appl. No. 17/484,370, mailed on Sep. 27, 2022, 10 pages.

Non-Final Rejection Mailed on Feb. 19, 2021 for U.S. Appl. No. 16/746,565.

Non-Final Rejection Mailed on Sep. 22, 2022 for U.S. Appl. No. 17/481,710.

Notice of Allowance and Fees Due (PTOL-85) Mailed on Feb. 19, 2021 for U.S. Appl. No. 16/746,400.

Notice of Allowance Mailed on May 26, 2021 for U.S. Appl. No. 16/746,400.

Soren Dhoore et al., "Novel adiabatic tapered couplers for active III-V/SI devices fabricated through transfer printing", "Optics Express", Jun. 6, 2016, DOI:10.1364/OE.24.012976, pp. 12976-12990, vol. 24, No. 12.

Examiner Interview Summary Record (PTOL-413) Mailed on Jun. 13, 2023 for U.S. Appl. No. 17/481,710, 1 page(s).

Notice of Allowance and Fees Due (PTOL-85) Mailed on Jun. 13, 2023 for U.S. Appl. No. 17/481,710, 8 page(s).

Notice of Allowance and Fees Due (PTOL-85) Mailed on Jan. 25, 2023 for U.S. Appl. No. 17/484,370.

\* cited by examiner

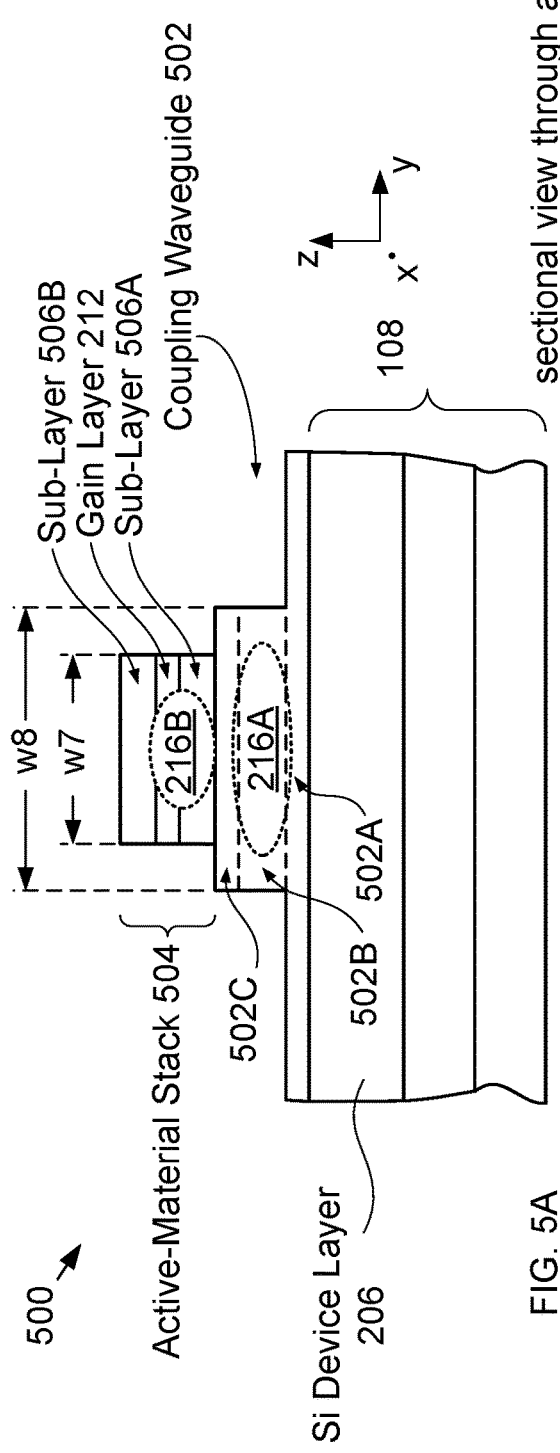
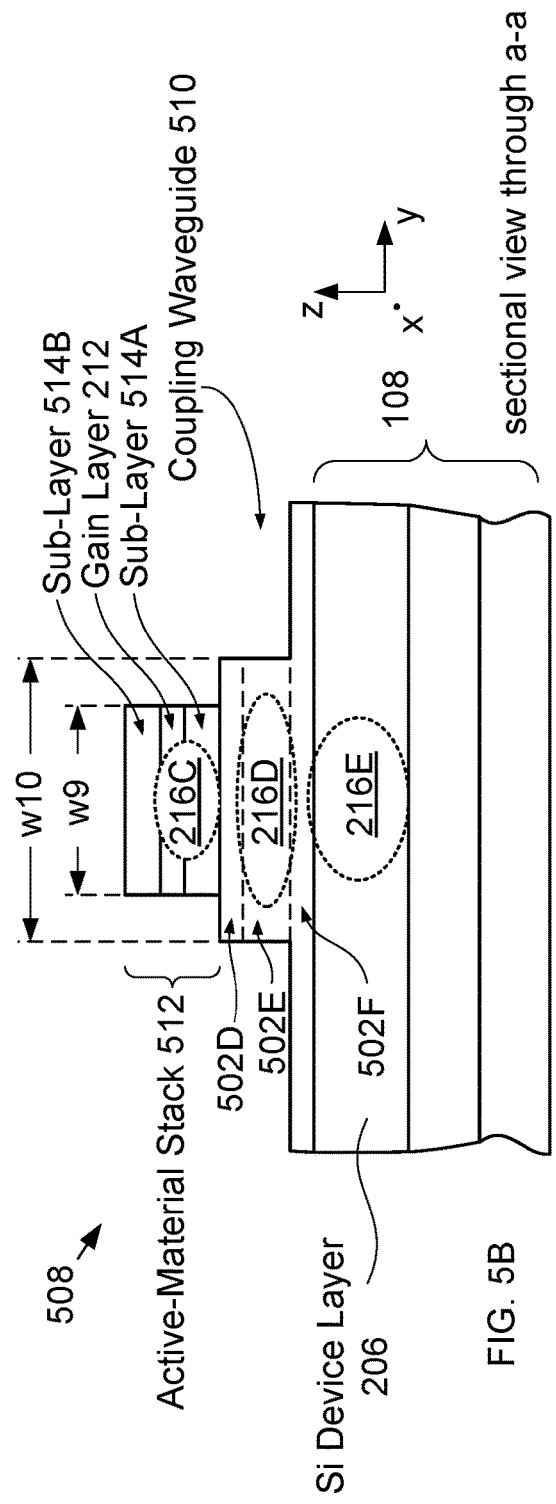
FIG. 5A
FIG. 5B

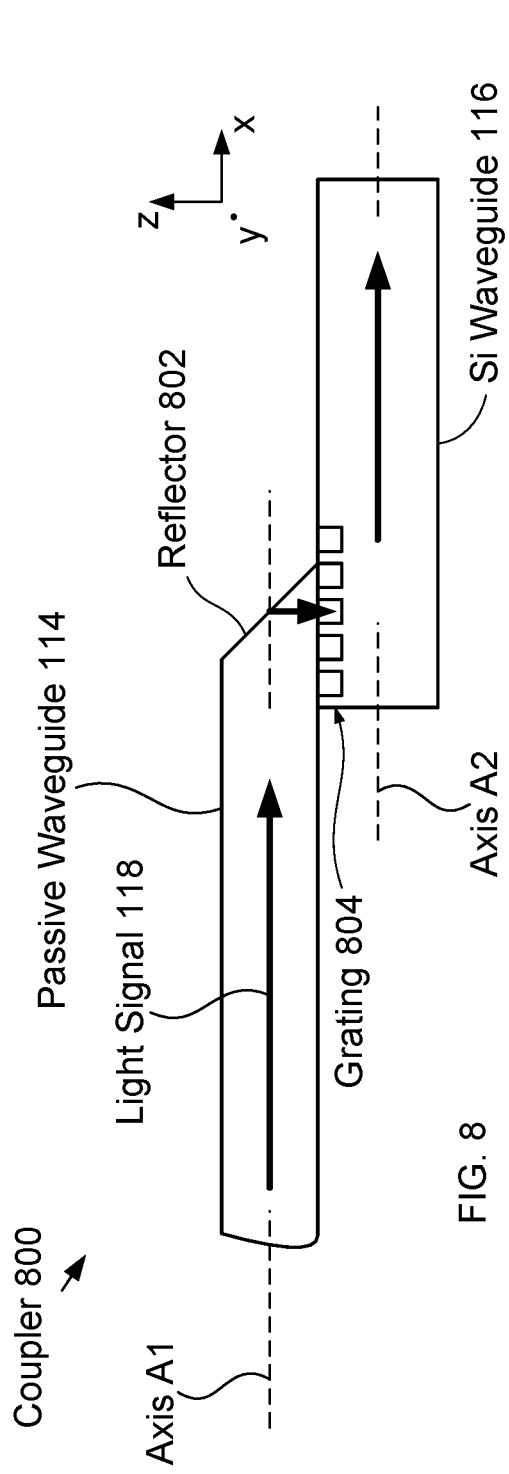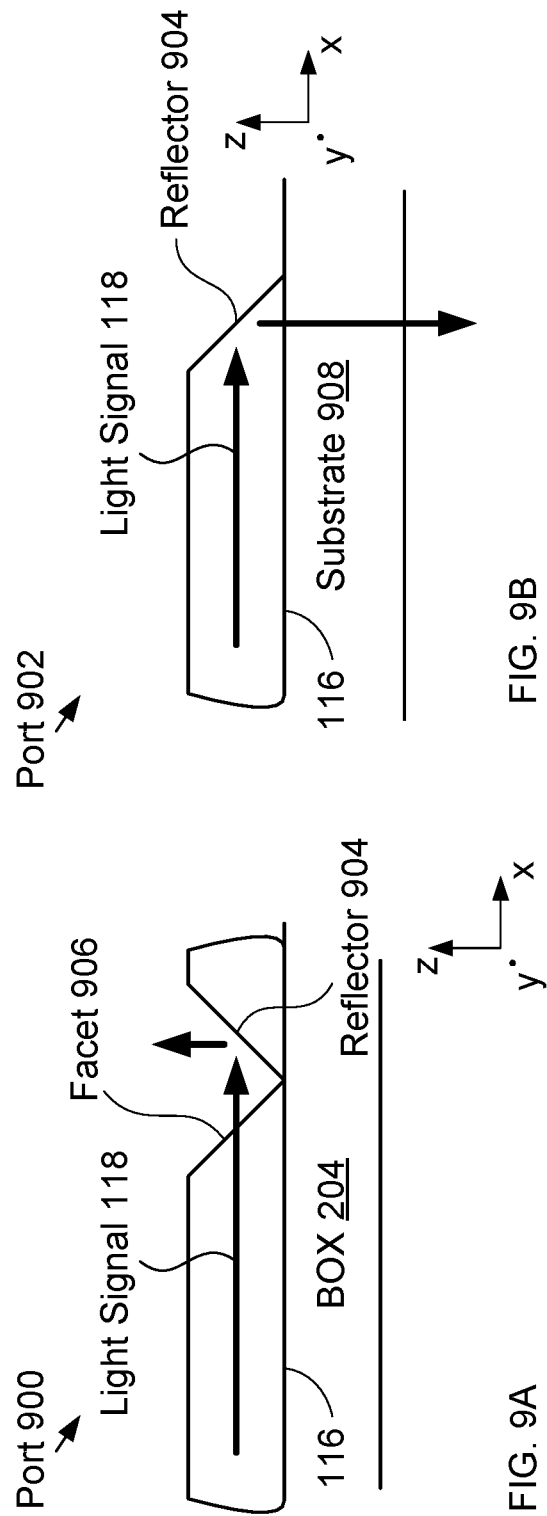

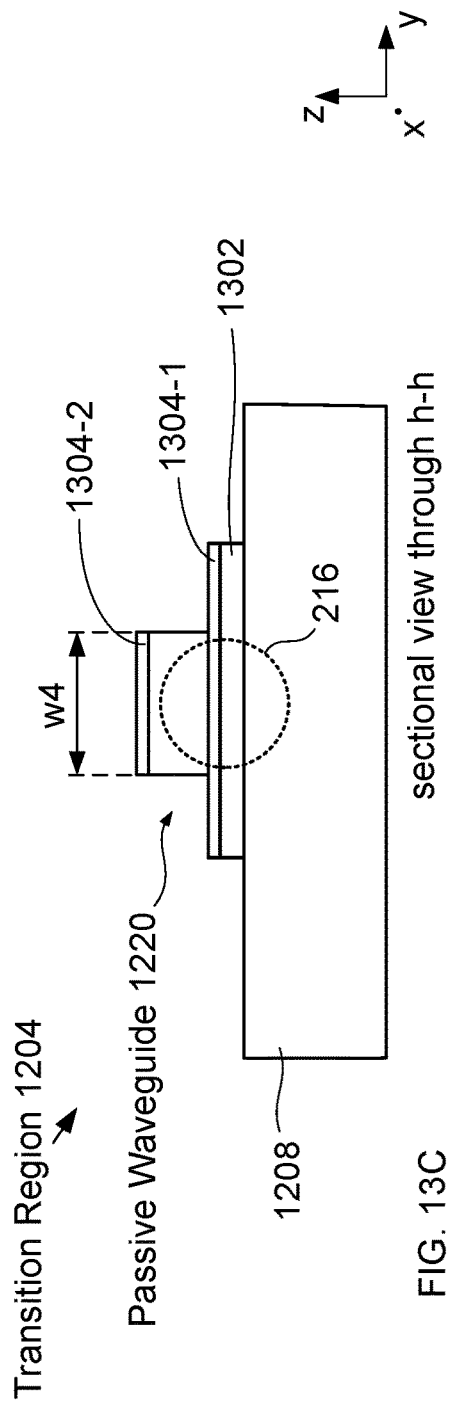
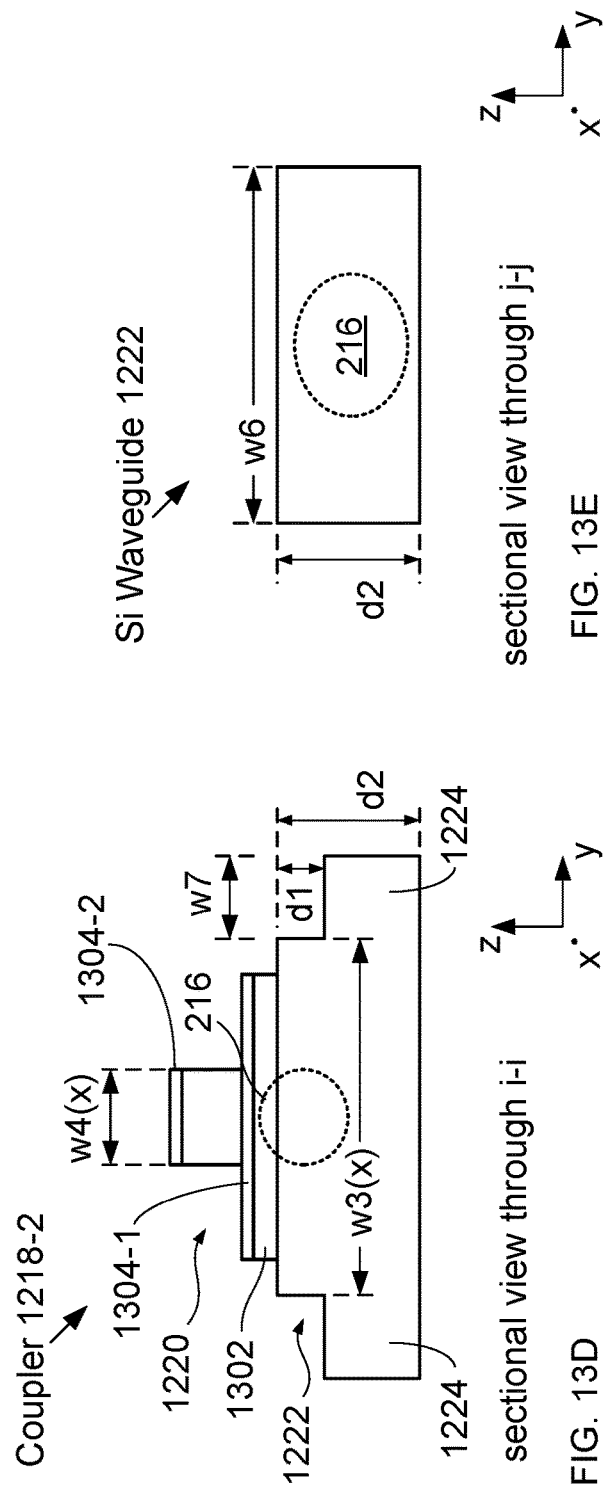

SYSTEM COMPRISING AN INTEGRATED WAVEGUIDE-COUPLED OPTICALLY ACTIVE DEVICE AND METHOD OF FORMATION

CROSS REFERENCE TO RELATED APPLICATIONS

This application is a continuation of U.S. Non-Provisional application Ser. No. 17/484,370, filed Sep. 24, 2021, entitled "System Comprising an Integrated Waveguide-Coupled Optically Active Device and Method of Formation," which is a continuation-in-part of U.S. Non-Provisional application Ser. No. 16/746,400 (now U.S. Pat. No. 11,131,806), filed Jan. 17, 2020, entitled "System Comprising an Integrated Waveguide-Coupled Optically Active Device and Method of Formation," which claims priority to U.S. Provisional Patent Application Ser. No. 62/961,348, filed Jan. 15, 2020, entitled "System Comprising an Integrated Waveguide-Coupled Optically Active Device and Method of Formation," each of which is incorporated by reference. If there are any contradictions or inconsistencies in language between this application and one or more of the cases that have been incorporated by reference that might affect the interpretation of the claims in this case, the claims in this case should be interpreted to be consistent with the language in this case.

TECHNICAL FIELD

The present disclosure relates to heterogeneous integration of compound-semiconductor structures on silicon substrates in general, and, more particularly, to the integration of compound-semiconductor active and passive photonic elements with silicon for forming semiconductor waveguides, active electronic devices, and/or active and passive photonic devices.

BACKGROUND

Silicon photonics promises relatively low-cost solutions for many photonic applications. However, historically, most silicon-photonics systems cannot generate light on the chip. As a result, there are ongoing efforts toward enabling on-chip light generation, amplification, modulation, etc. via heterogeneous silicon-photonic integration.

Some success in providing on-chip light generation, amplification, modulation, etc., in silicon-photonics systems has been achieved by integrating compound-semiconductor material onto a substrate containing silicon waveguides via direct bonding and subsequent formation of active compound-semiconductor waveguides above silicon waveguides.

In some alternative prior-art approaches, discrete optically active devices (e.g., lasers, amplifiers, modulators, etc.) are completely formed separately and optically coupled with a photonic integrated circuit (PIC) through, for example fiber coupling the device and the PIC, flip chip bonding the device onto the PIC substrate and optically coupling it with a silicon waveguide on the PIC via a silicon grating coupler, or employing conventional packaging methods wherein light is coupled between the discrete device and a silicon waveguide on the PIC.

Unfortunately, the cost and complexity of such approaches have, thus far, limited their use.

A platform that enables cost-effective formation of a heterogeneous silicon photonic system in a cost-effective manner remains, as yet, unmet in the prior art.

SUMMARY

The present disclosure is directed toward integrated-optics systems that include an optically active device optically coupled with a silicon waveguide via a passive compound-semiconductor waveguide, where the optically active device, the passive waveguide, and the silicon waveguide reside on a common substrate. Embodiments in accordance with the present disclosure are particularly well suited for use in distributed-feedback lasers, mode locked lasers, photonic integrated circuits, external-cavity mode locked lasers, loop-mediated isothermal amplification devices, and the like.

An advance is made over the prior art by employing a passive compound-semiconductor waveguide as a transition element between an optically active device and a silicon waveguide. The optically active device includes active material that is disposed on and optically coupled with a compound semiconductor coupling waveguide. The active material resides completely in a first region of a substrate. The silicon waveguide is wholly contained in a second region of the substrate. The passive waveguide resides in a transition region between the first and second regions and extends into these regions such that the passive waveguide is optically coupled with each of the optically active device and silicon waveguide. The active material, the coupling waveguide, the passive waveguide, and the silicon waveguide configured to dictate the vertical location and lateral confinement of optical energy at each point along the length of the system.

Additional advances over the prior art are made by employing one or more etch-stop layers at critical points in the fabrication process to facilitate fabrication of narrow and/or sharp features (e.g., tapers) in one or more waveguide layers, where such features are extremely difficult to form using conventional approaches. In some embodiments, narrow/sharp features are formed in a single etch process or, alternatively, via a two-step etching process in which a more-easily lithographically defined features is formed in a first lithography/etching step, followed by a second etching step in which crystallographically dependent etch is used to further refine the feature such that it is based on one or more sidewalls that are defined by a crystal plane of the etched material.

In addition, in some embodiments, an optical element, such as a waveguide grating, is included in the gain section of an optically active device, where the optical element is formed in a silicon layer on which an active-material stack is disposed. In some such embodiments, the optically active device and optical element collectively define a laser structure, such as a distributed feedback laser.

The use of a compound-semiconductor passive waveguide as a transition element to optically couple an optically active device and a silicon waveguide affords significant advantages over the prior art, such as:
  i. independent control over the performance of the optically active device and the coupling efficiency of a light signal into the silicon waveguide, thereby enabling each to be substantially optimized without degrading the other; or
  ii. transition of a light signal between the optically active device and the silicon waveguide with less optical loss than can be achieved in the prior art; or
  iii. in monolithically integrated systems, facilitated epitaxial growth of the optically active device by virtue of the presence of a compound semiconductor layer from which the passive waveguide is formed in the first region;

iv. in heterogeneously integrated systems, facilitated bonding of nascent optical-device material on the common substrate by virtue of the presence in the active region of a compound semiconductor layer, from which the passive waveguide is formed; or v. any combination of i, ii, iii, and iv.

Further advance over the prior art is made by defining a coupling waveguide and a passive waveguide from contiguous portions of a compound-semiconductor layer and forming a composite waveguide having a rib portion that is an optically active device and a planar portion that is the coupling waveguide. By tailoring the lateral dimensions of the optically active device, the size and/or vertical position of an optical mode of a light signal in the composite waveguide can be controlled. As a result, the optical mode can be located at least partially in the optically active device at one location and forced substantially completely into the passive waveguide as the light signal propagates to a second location.

An illustrative embodiment is a waveguide-coupled optical system having an active region, an output-coupling region, and a transition region, each of which is disposed on a silicon-on-insulator substrate. The system includes: a quantum-dot laser whose active material is located completely within an active region, where it is disposed on and optically coupled with a gallium arsenide coupling waveguide; a silicon waveguide that resides completely in the output-coupling region; and a passive gallium-arsenide waveguide that resides in the transition region and extends into each of the active and output-coupling regions where it is optically coupled with the laser and the silicon waveguide, respectively. As a result, the passive waveguide couples optical energy generated by the laser into the silicon waveguide.

In the active region, the active material is patterned to define a tapered region that defines a first coupler that facilitates transfer of optical energy generated in the laser structure into a light signal propagating in the coupling waveguide.

In the output-coupling region, the silicon device layer of the silicon-on-insulator substrate is patterned to define a silicon waveguide that functions as a single-mode waveguide for the light signal.

In the transition region, the coupling waveguide is patterned to define a single-mode passive waveguide for the light signal. No optically active material or electrical contacts are present in the transition region. The passive waveguide extends slightly into the output-coupling region, where it is tapered to define a second coupler that facilitates transfer of the light signal into the silicon waveguide.

In some embodiments, the coupling layer includes a lower sub-layer and an upper sub-layer, where the lower sub-layer is doped to facilitate forming electrical contacts. The upper sub-layer is characterized by a higher refractive index than the lower sub-layer, thereby enabling the lower sub-layer to also function as a lower cladding layer. In some embodiments, the upper sub-layer is characterized by a lower refractive index than the lower sub-layer.

In some embodiments, the optically active device is a device other than a laser, such as an optical modulator (e.g., an electroabsorption modulator, a phase modulator, etc.), an optical amplifier, a variable optical attenuator, a photodetector, and the like. In some embodiments, the optically active device includes a quantum element other than a quantum dot, such as a quantum dash, quantum well, a quantum wire, and the like. In some embodiments, optically active device does not include a quantum element.

In some embodiments, the active region includes an optically active device and coupling layer of a different compound semiconductor, such as indium phosphide, indium gallium arsenide phosphide, and the like. As a result, the passive waveguide also comprises this different compound semiconductor.

In some embodiments, a reflector is defined in at least one of the passive and silicon waveguides to redirect a light signal. In some embodiments, the reflector is defined in the passive waveguide and is configured to optically couple with a vertical grating coupler defined in the silicon waveguide.

In some embodiments, an alignment feature is included for passively aligning a bulk optical element (e.g., an optical fiber, a photodetector, a light source, etc.), to one of the passive and silicon waveguides. In some such embodiments, this alignment feature is a silicon-optical-bench feature.

In some embodiments, the silicon waveguide is not included and the passive waveguide functions as an optical interface to another optical element. In some embodiments, the other optical element and the optically active device are disposed on the same substrate. In some embodiments, the other optical element is external to the substrate comprising the optically active device. In some such embodiments, the passive waveguide is configured such that its optical mode is substantially matched with the optical mode of an external element to mitigate optical coupling loss.

In some embodiments, a spot-size converter is included in the passive waveguide and/or the silicon waveguide to facilitate optical coupling with an external element.

An embodiment in accordance with the present disclosure is an integrated-optics system disposed on a substrate that defines a first plane, the system comprising: (1) an optically active device that is selectively located in a first region of the substrate, wherein the optically active device includes: (a) an active-material stack comprising a gain section and a first taper; and (b) a coupling waveguide that includes a first layer disposed on a contact layer, the first layer comprising a first compound semiconductor and the contact layer comprising a second compound semiconductor, wherein the coupling waveguide at least partially supports a first optical mode of a light signal; wherein the active-material stack and the coupling waveguide collectively define a composite waveguide that at least partially supports the first optical mode; and (2) a silicon layer that includes a silicon waveguide that is selectively located in a second region of the substrate, the silicon waveguide being configured to at least partially support the first optical mode; and wherein the coupling waveguide extends from the first region to a second taper located in the second region, the second taper being configured to optically couple the first optical mode from the composite waveguide into the silicon waveguide.

Another embodiment in accordance with the present disclosure is a method for forming an integrated-optics system disposed on a first substrate that defines a first plane, the system having a first region, a second region, and a third region, and comprising an optically active device that is optically coupled with a silicon waveguide, the method including: forming a coupling waveguide that extends from the first region to the third region, the coupling waveguide including a first layer disposed on a contact layer, the first layer comprising a first compound semiconductor and the contact layer comprising a second compound semiconductor, wherein the coupling waveguide at least partially supports a first optical mode of a light signal; forming an optically active device that includes an active-material stack comprising a third compound semiconductor, the active-material stack being disposed on the coupling waveguide to collectively define a composite waveguide that at least partially supports the first optical mode, wherein the optically active device is located only in the first region; and patterning a silicon layer to define a silicon waveguide in the third region, the silicon waveguide being configured to at least partially support the optical mode, wherein the second waveguide is optically coupled with the active-material stack via the coupling waveguide.

BRIEF DESCRIPTION OF THE DRAWINGS

FIG. 5A depicts a schematic drawing of a sectional view of an alternative composite waveguide in accordance with the present disclosure.

FIG. 5B depicts a schematic drawing of a sectional view of another alternative composite waveguide in accordance with the present disclosure.

FIG. 8 depicts a schematic drawing of a cross-sectional view of yet another alternative coupler in accordance with the present disclosure.

FIGS. 9A-B depict schematic drawings of cross-sectional views of alternative output ports in accordance with the present disclosure.

FIGS. 13A-E depict schematic drawings of sectional views of system 1200 through lines f-f through j-j, respectively.

DETAILED DESCRIPTION

For the purposes of the present disclosure, including the appended claims, the following terms are defined:
 "disposed on" or "formed on" is defined as is defined as "exists on" an underlying material or layer with or without intermediate layers. For example, if a material is described to be "disposed (or grown) on a substrate," this can mean that either (1) the material is in intimate contact with the substrate; or (2) the material is in contact with one or more layers that reside on the substrate.
 optically active device is defined as an electrically coupled device (i.e., a device comprising electrical contacts for connecting to external circuitry) in which, in response to an electrical signal applied to the electrical contacts, either (a) photons are generated due to the recombination of free carriers; (b) free-carrier pairs are generated due to the absorption of photons; or (c) the phase of one or more photons is modified by an injected current or voltage. Examples of optically active devices include, without limitation, lasers, optical amplifiers, optical modulators (e.g., electroabsorption modulators, phase modulators, etc.), variable optical attenuators, photodetectors, and the like. It should be noted that an optically active device does not require inclusion of a quantum-element-containing layer.
 quantum element is defined as a semiconductor structure that exhibits a quantum effect. Examples of quantum elements include, without limitation, quantum dots, quantum wells, quantum-well layers, quantum dashes, quantum wires, and the like.
 passive waveguide is defined as a surface waveguide in which light passes through virtually unperturbed. Passive waveguides are not operatively coupled with electrical contacts and are not stimulated to exhibit optoelectronic effects, such conversion of free carriers into photons or vice versa, optical modulation, optical amplification, and the like.

For the purposes of this Specification, including the appended claims, the terms "lateral" and "vertical" as used are meant to be relative to the major surfaces of a substrate on which an integrated-optics system resides, where the term lateral refers to directions that are parallel to the major surfaces and the term vertical refers to directions that are normal to the major surfaces. In similar fashion, the term "lower" means more proximate to the substrate and the term "higher" means more distal from the substrate.

Figure 1:
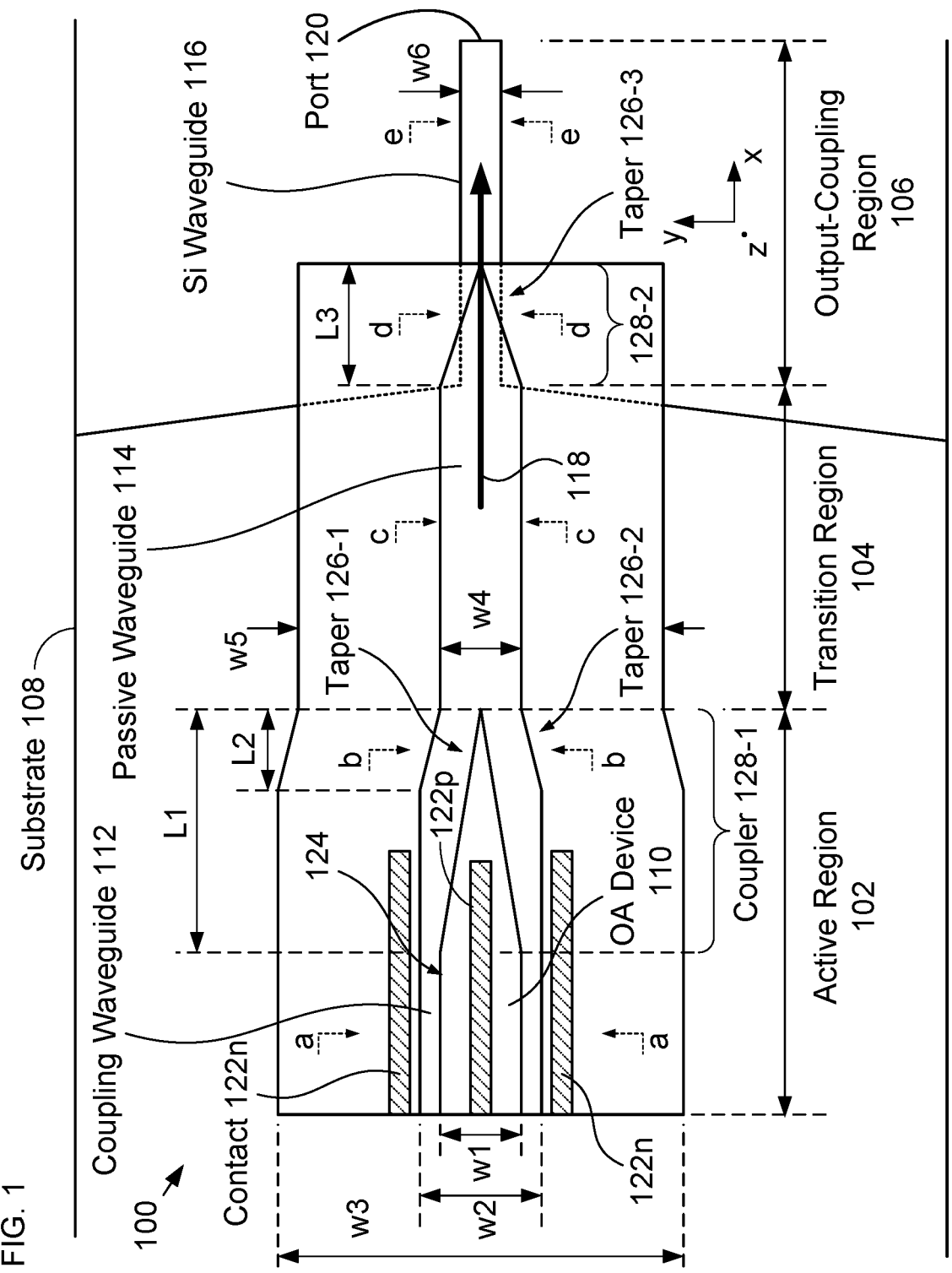
FIG. 1 depicts a schematic drawing of a top view of an illustrative integrated-optics system in accordance with the present disclosure.

FIG. 1 depicts a schematic drawing of a top view of an illustrative integrated-optics system in accordance with the present disclosure. System 100 includes active region 102, transition region 104, and output-coupling region 106, which are disposed on substrate 108. Active region 102, transition region 104, and output-coupling region 106 are contiguous regions that collectively define an integrated-optics-based, silicon-waveguide-coupled laser. System 100 comprises optically active (OA) device 110, coupling waveguide 112, passive waveguide 114, and silicon waveguide 116, which are arranged such that optical energy generated by OA device 110 propagates as light signal 118 from the laser to port 120.

It should be noted that, although the illustrative embodiment is an integrated-optics-based, silicon-waveguide-coupled laser wherein light is generated in an optically active device and propagates to a waveguide port, embodiments in accordance with the present disclosure include systems wherein a light signal is coupled into a waveguide port and conveyed to an OA device. Furthermore, in some embodiments, no silicon waveguide is included and port 120 is located in passive waveguide 114. Furthermore, in some embodiments, more than one passive waveguide and/or silicon waveguide is included.

FIGS. 2A-E depict schematic drawings of sectional views of system 100 through lines a-a through e-e, respectively.

Figure 2A:
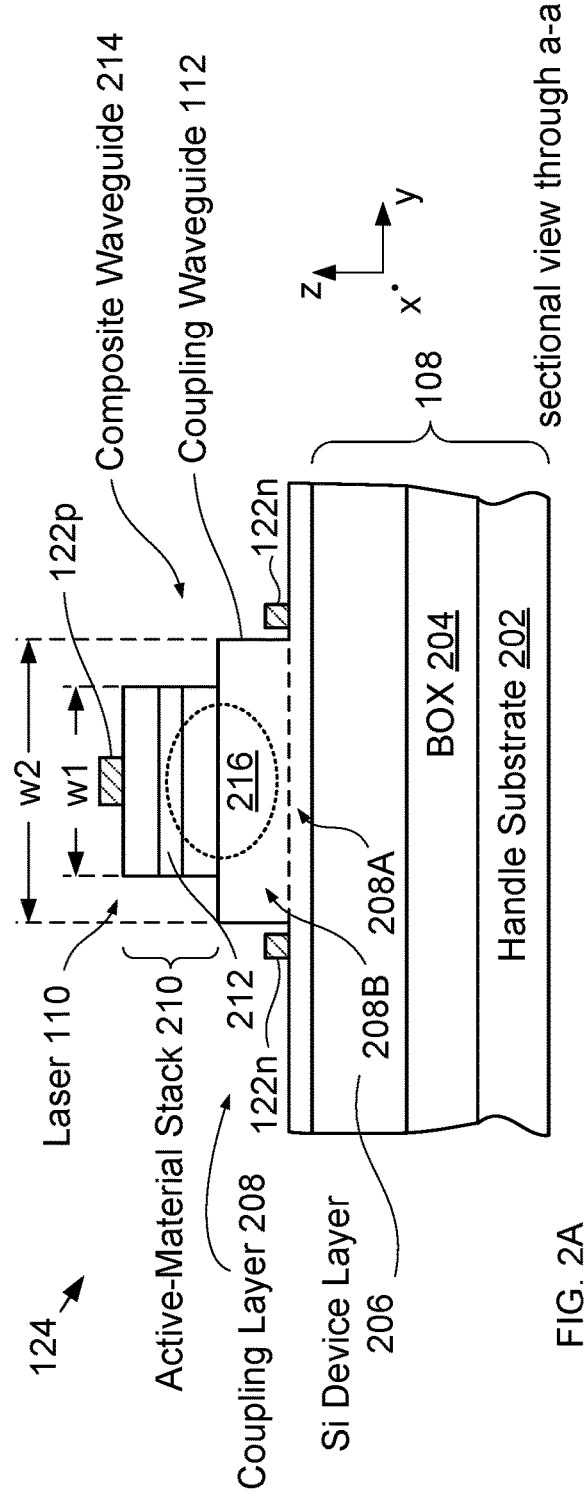
FIGS. 2A-E depict sectional views of system 100 through lines a-a through e-e, respectively.
Figure 2B:
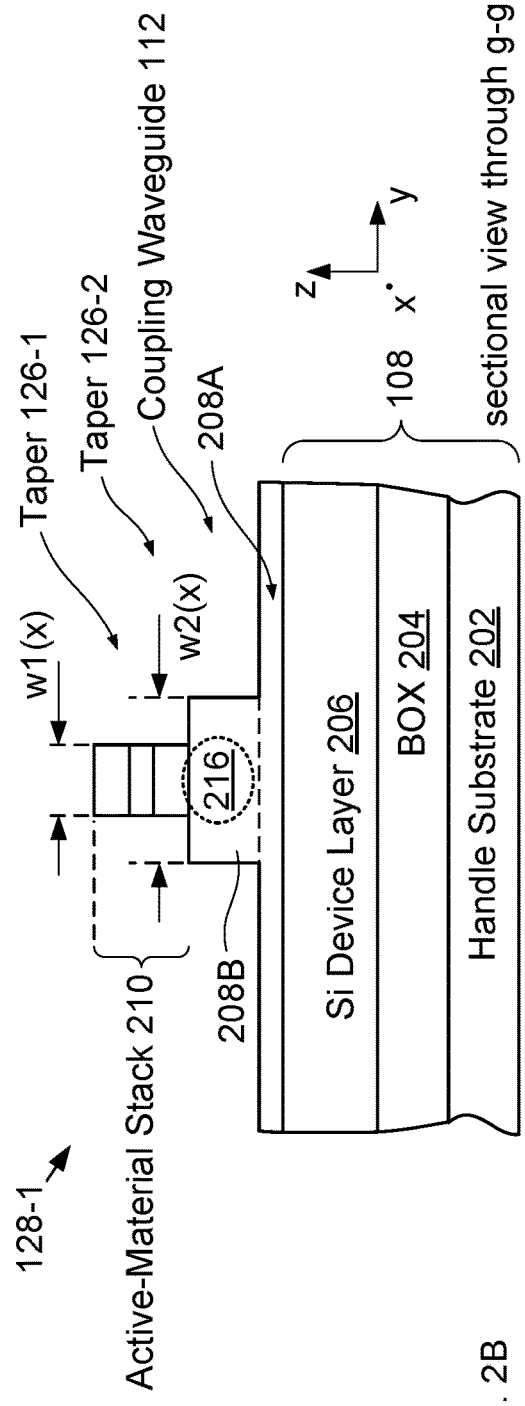
Figure 2C:
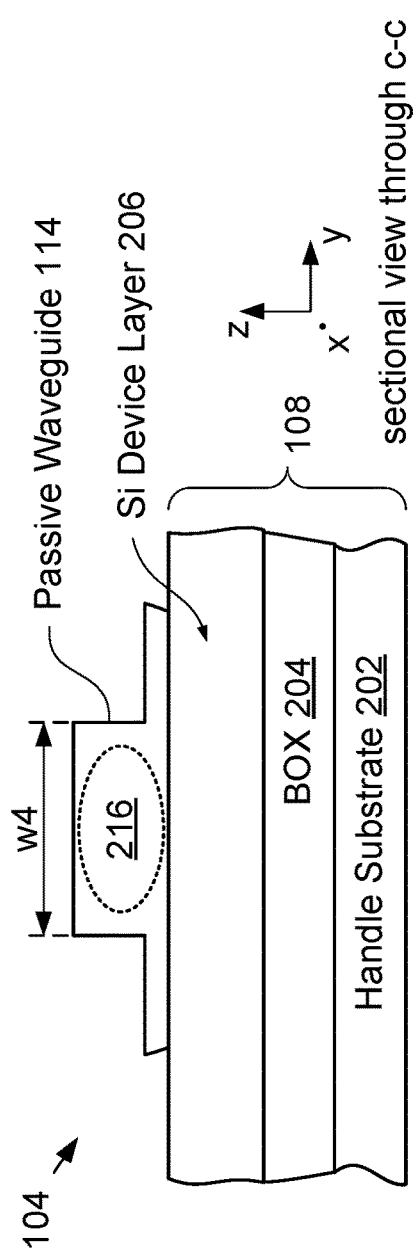
Figure 2D:
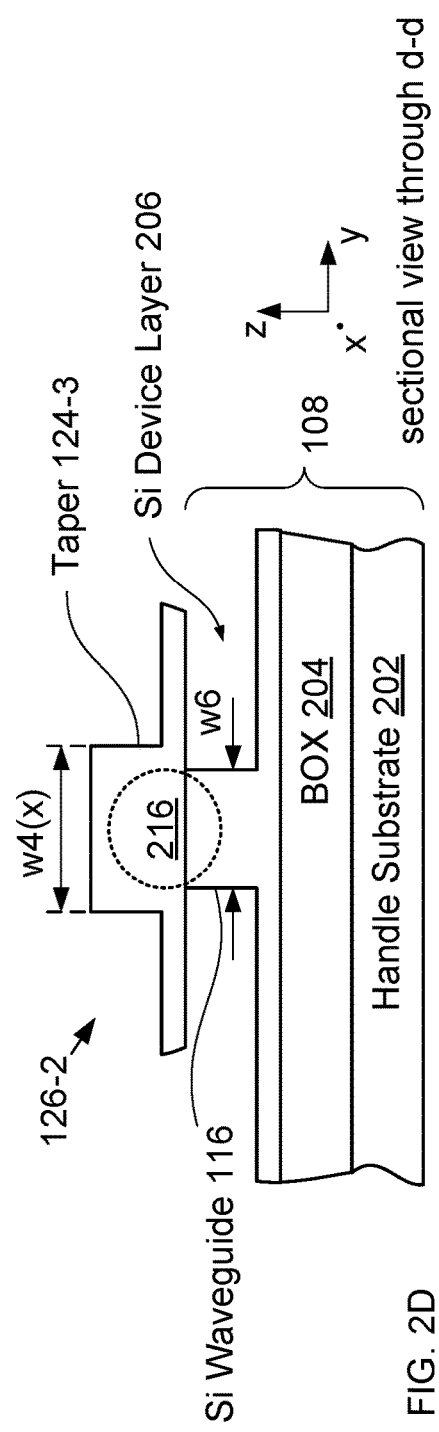
Figure 2E:
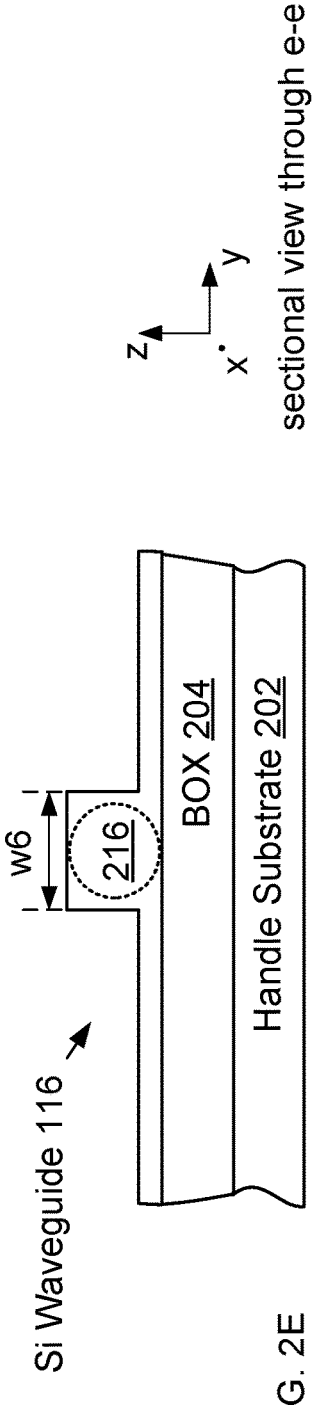
Figure 3:
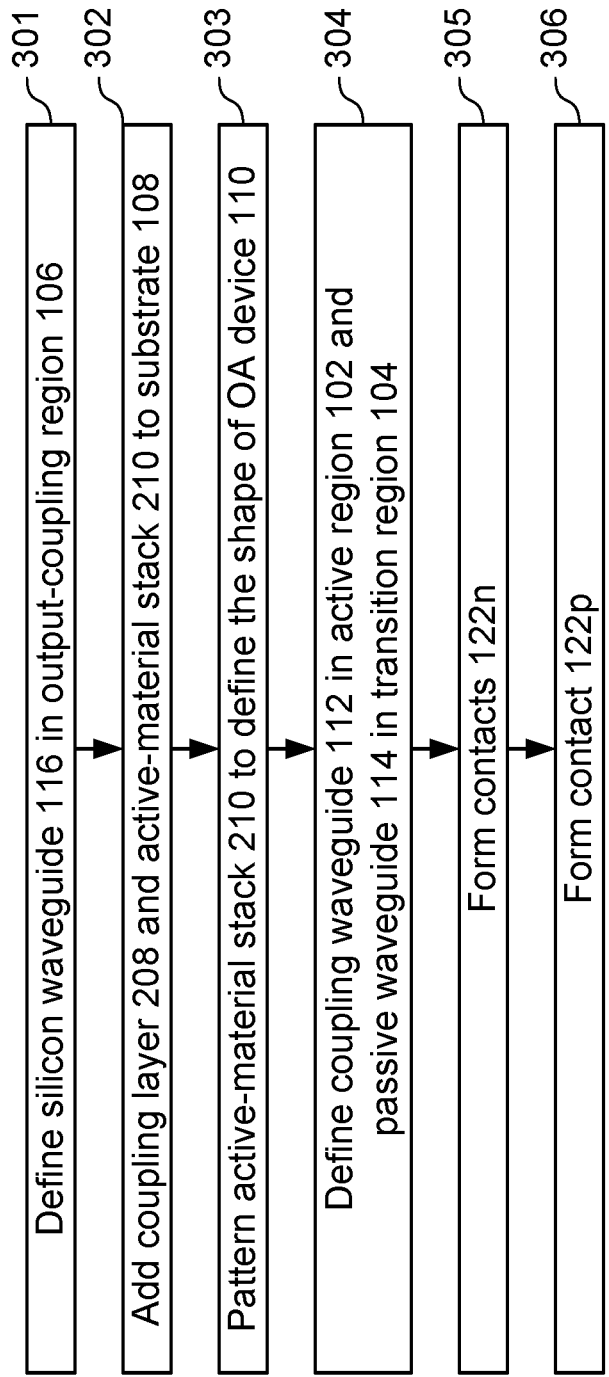
FIG. 3 depicts operations of a method suitable for forming system 100 in accordance with the illustrative embodiment.

FIG. 3 depicts operations of a method suitable for forming system 100 in accordance with the illustrative embodiment. Method 300 is described with continuing reference to FIGS. 1 and 2A-E. Method 300 begins with operation 301, wherein silicon waveguide 116 is defined on substrate 108 in output-coupling region 106.

Substrate 108 is a conventional silicon-on-insulator (SOI) substrate comprising handle substrate 202, buried oxide layer (BOX) 204, and silicon device layer 206. In the depicted example, handle substrate 202 is a conventional silicon wafer, BOX 204 is a layer of thermally grown silicon dioxide having a thickness that is typically within the range of approximately 1-2 microns and, preferably, 2 microns, and silicon device layer 206 is a layer of single-crystal silicon having a thickness equal to approximately 220 nm. As will be apparent to one skilled in the art after reading this Specification, however, substrate 108 can be any substrate suitable for use in system 100. Examples of substrates suitable for use in accordance with the present disclosure include, without limitation, glass substrates, compound-semiconductor substrates, bulk silicon substrates, and the like.

Silicon waveguide 116 is a rib waveguide having a rib portion of width w6. In output-coupling region 106, silicon waveguide is configured enable the waveguide to support single-mode propagation of light signal 118. Silicon waveguide 116 is formed by patterning silicon device layer 206 via conventional lithography and etching to define its structure. In some embodiments, silicon waveguide 116 has a waveguide structure other than that of a rib waveguide, such as a channel waveguide, strip waveguide, ridge waveguide, etc.

At operation 302, coupling layer 208 and active-material stack 210 are added to substrate 108.

In the depicted example, heterogeneous integration techniques are used to add coupling layer 208 and active-material stack 210 to substrate 108. Heterogeneous integration techniques suitable for use in accordance with the present disclosure are described in, for example, U.S. Pat. Nos. 9,097,848, 9,910,120, 8,830,033, 8,620,164, each of which is incorporated herein by reference in their entirety.

In accordance with conventional heterogeneous integration, a separate photonic substrate is formed by epitaxially growing active-material stack 210 and coupling layer 208 on a sacrificial substrate.

Figure 4A:
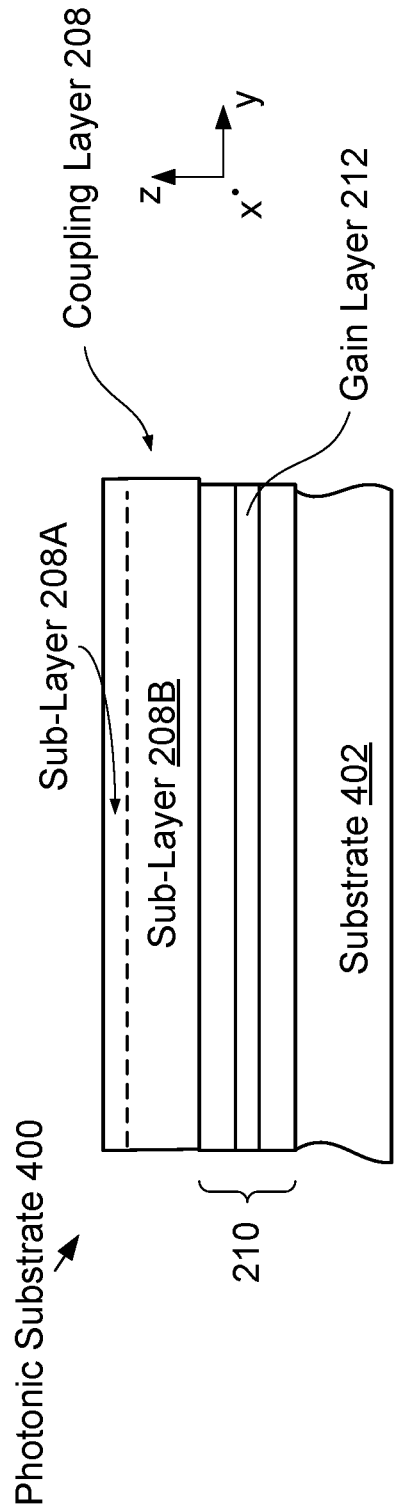
FIG. 4A depicts a cross-sectional drawing of a portion of a sacrificial substrate comprising coupling layer 208 and active-material stack 210.

FIG. 4A depicts a schematic drawing of a cross-sectional view of a portion of a photonic substrate in accordance with the illustrative embodiment. Photonic substrate 400 includes coupling layer 208 disposed on active-material stack 210, which is disposed on sacrificial substrate 402.

In the depicted example, sacrificial substrate 402 is a conventional gallium arsenide wafer and coupling layer 208 is a layer of gallium arsenide having a thickness suitable for supporting single-mode propagation of light signal 118. In some embodiments, at least one of sacrificial substrate 402 and coupling layer 208 comprises a compound semiconductor other than gallium arsenide, such as indium phosphide, indium gallium arsenide, indium gallium arsenide phosphide, and the like.

Preferably, coupling layer 208 comprises sub-layers 208A and 208B, where sub-layer 208A has a lower refractive index than that of sub-layer 208B. As a result, sub-layer 208A can function as a cladding layer that serves to substantially confine at least a portion of the optical mode of light signal 118 to sub-layer 208B as the light signal propagates through passive waveguide 114. In some embodiments, coupling layer 208 includes at least one additional sub-layer distal to sub-layer 208A, where this additional sub-layer or sub-layers are configured to function as an upper cladding for sub-layer 208B. In some embodiments, coupling layer 208 does not include sub-layers (i.e., it is a homogeneous layer).

Furthermore, in some embodiments, sub-layer 208A is doped to reduce contact resistance for contacts 122$n$.

Active-material stack 210 includes the constituent layers of OA device 110, including cladding layers, carrier confinement layers, and gain layer 212. In the depicted example, OA device 110 is a quantum-dot laser comprising active-material stack 210. In some embodiments, OA device 110 is a different optically active device, such as an optical modulator (e.g., an electroabsorption modulator, a phase modulator, etc.), an optical amplifier, a variable optical attenuator, a photodetector, and the like.

It should be noted that, although the illustrative embodiment includes a gain layer comprising a plurality of quantum dots, gain layer 212 can include one or more layers comprising any one or more of a wide variety of quantum elements without departing from the scope of the present disclosure. Quantum elements suitable for inclusion in gain layer 212 include, without limitation, quantum wells, quantum-well layers, quantum wires, quantum dashes, and the like.

In addition, as discussed below, preferably, active-material stack 210 also includes sub-layers having different refractive indices to control the vertical position of optical mode 216. For example, in some embodiments, active-material stack 210 contains higher aluminum content with gallium arsenide in the layers between gain layer 212 and its top contact layer. This provides a lower index of refraction that can force optical energy in an optical mode within the material stack downward toward coupling waveguide 112. Furthermore, defining the active-material stack as a ridge or rib also helps force the optical mode toward the coupling waveguide while serving to laterally contain the optical mode as well.

In some embodiments, a dielectric layer is included between coupling layer 208 and silicon device layer 206 to act as a lower cladding that confines the optical mode toward at least one of the middle portion of passive waveguide 114 and the middle portion of active-material stack 210.

In some embodiments, active-material stack 210 also includes a region between gain layer 212 and coupling waveguide 112 that has higher aluminum content to create a lower index of refraction, thereby forcing the optical mode upward away from the coupling waveguide. It should be noted that this same layer can also function as an upper cladding for coupling waveguide 112.

Once active-material stack 210 and coupling layer 208 are complete, photonic substrate 400 is then flipped over and coupling layer 208 is bonded to silicon device layer 206 via direct bonding. In some embodiments, a different bonding technology is used to join coupling layer 208 and device layer 206, such as plasma bonding, fusion bonding, thermoanodic bonding, and the like. In some embodiments, an interface layer is included between silicon device layer 206 and coupling layer 208 to facilitate their bonding.

Once photonic substrate 400 and substrate 108 are bonded, sacrificial substrate 402 is removed in conventional fashion.

Figure 4B:
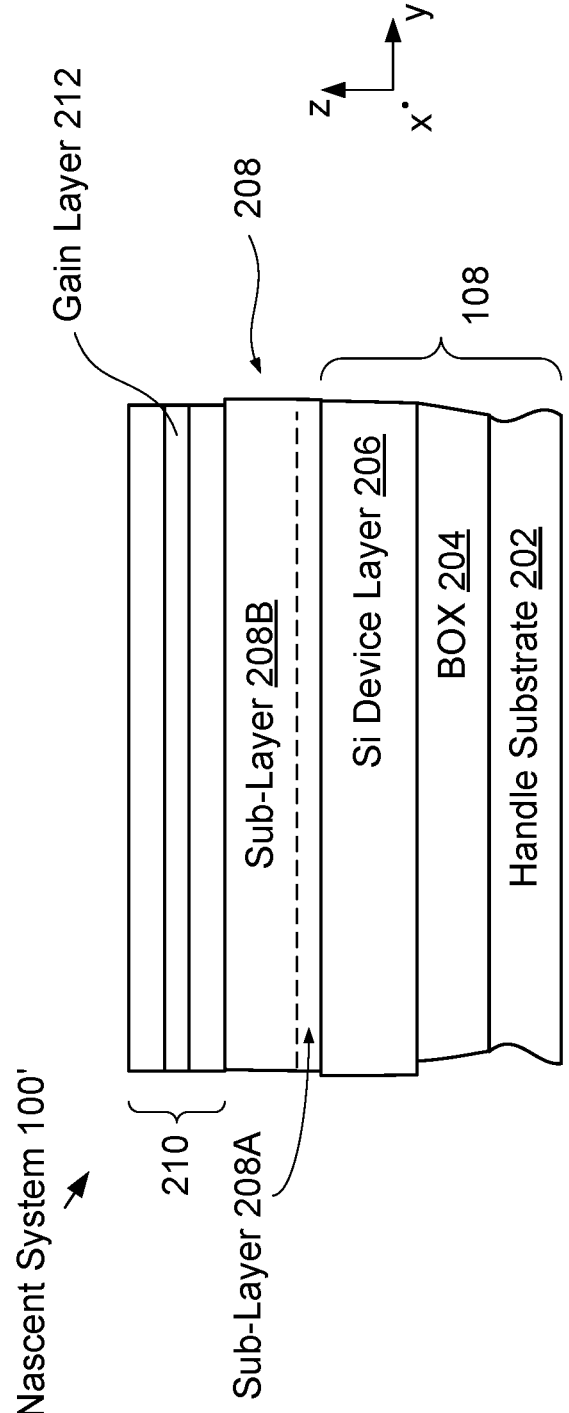
FIG. 4B depicts a schematic drawing of a cross-sectional view of nascent system 100' after the removal of sacrificial substrate 402.

FIG. 4B depicts a schematic drawing of a cross-sectional view of nascent system 100' after the removal of sacrificial substrate 402.

Although in the depicted example, coupling layer 208 and active-material stack 210 are added to substrate 108 via heterogeneous bonding techniques, in some embodiments, they are epitaxially grown on the substrate. In such embodiments, coupling layer 208 is grown directly on silicon device layer 206 via hetero-epitaxial growth, which is followed by epitaxial growth of active-material stack 210 on the coupling layer.

Returning now to method 300, at operation 303, active-material stack 210 is patterned to define the lateral dimensions of OA device 110. It should be noted that this removes active material completely from each of transition region 104 and output-coupling region 106. As a result, optically active material is selectively included in active region 102. However, as will be apparent to one skilled in the art, after reading this Specification, in some embodiments, a substrate has multiple active regions, each containing corresponding patterns of active-material stack 210. In some embodiments, at least one of the constituent layers of active-material stack 210 is patterned using a mask specific to that layer, while at least one other of the constituent layers is patterned using a different mask.

OA device 110 is patterned such that it has nominal width w1 outside of the area of coupler 128-1, where the value of w1 is selected to facilitate lateral confinement of light signal 118 in the active region. In the depicted example, w1 is equal to 2 microns; however, w1 can have any suitable value. Typically, w1 is within the range of approximately 0.5 micron to approximately 4 microns.

At operation 304, coupling layer 208 is patterned in conventional fashion to define coupling waveguide 112 in active region 102 and passive waveguide 114 in transition region 104, where the passive waveguide supports single-mode propagation of light signal 118. It should be noted, however, that in active region 102, coupling waveguide 112 is not typically a single-mode waveguide for light signal 118.

Coupling waveguide 112 is formed as a rib waveguide. Coupling waveguide 112 includes a central ridge portion having width w2 and a planar portion having width w3. In the depicted example, w2 and w3 are 6 microns and 100 microns, respectively; however, each of w2 and w3 can have any suitable value. Typically, the value of w2 is within the range of approximately 0.5 micron to 20 microns. As will be apparent to one skilled in the art, the value of w3 is not typically critical, but is normally within the range of 25 to 500 microns.

It should be noted that, after operation 304, active-material stack 210 and coupling waveguide 112 collectively define composite waveguide 214 as a rib waveguide (also sometimes referred to as a strip waveguide), where the active-material stack functions as the projecting ridge portion of the composite waveguide and the central ridge portion of coupling waveguide 112 functions as the planar portion of the rib waveguide.

In the depicted example, the width, w2, of coupling waveguide 112 is selected such that the coupling waveguide, itself, contributes little or no lateral confinement of optical mode 216 within active region 102. As a result, the shape and size of optical mode 216 in active region 102 is determined primarily by the lateral dimensions of active-material stack 210. In some embodiments, however, coupling waveguide 112 has a width that enables the coupling waveguide to provide lateral confinement of the optical mode. In some embodiments, the width of coupling waveguide 112 is substantially equal to the width of active-material stack 210 (i.e., w2=w1 and the coupling waveguide is substantially a channel waveguide).

Passive waveguide 114 is also formed as a rib waveguide comprising a central ridge portion having width w4 and a planar region having width w5. In the depicted example, w4 and w5 are 2 microns and 10 microns, respectively; however, each of w4 and w5 can have any suitable value. Typically, the value of w4 is within the range of approximately 0.5 micron to 4 microns. As will be apparent to one skilled in the art, the value of w5 is not typically critical, but is normally within the range of 0.5 to 100 microns.

Since coupling waveguide 112 and passive waveguide 114 are continuous segments of coupling layer 208, they are inherently optically coupled.

At operation 304, contacts 122n are formed outside the central ridge portion of coupling waveguide 112.

At operation 305, contact 122p is formed on the top surface of OA device 110 to complete the formation of system 100. It should be noted that, in some embodiments, the doping profile of the III-V material layers of gain section 1210 is reversed and, as a result, the positions of contacts 122n and 122p are reversed.

It should be noted that, in some embodiments, coupling waveguide is a slab waveguide (i.e., no ridge and planar portions are defined in coupling layer 208 within active region 102). In such embodiments, contacts 122n can be formed on the top surface of the coupling layer, in vias partially etched down to sub-layer 208A, or in any manner suitable for making them operatively coupled with OA device 110. In some embodiments, coupling waveguide 112 is formed as a channel waveguide (i.e., no planar portion remains after coupling layer 208 has been etched to define the waveguide). In such embodiments, device layer is in electrical contact with sub-layer 208A and contacts 122n are formed in silicon device layer 206.

Upon completion of system 100, active region 102 selectively includes OA device 110 and coupling waveguide 112, output-coupling region 106 selectively includes silicon waveguide 116, and transition region 104 includes passive waveguide 114. Passive waveguide 114 also extends into active region 102 to form coupler 128-1 with coupling waveguide 112 and extends into output-coupling region 106 to form coupler 128-2 with silicon waveguide 116.

It is an aspect of the present invention that the lateral dimensions of active-material stack 210 substantially determine the vertical position at which optical energy in OA device 110 forms an optical mode, as well as the shape of that optical mode. As a result, active-material stack 210 is defined such that it includes a first segment (i.e., gain section 124) that is configured to favor optical gain that gives rise to an optical mode and a second segment (i.e., taper 126-1) that is configured to force that optical mode into coupling waveguide 112.

FIG. 2A depicts a schematic drawing of a sectional view of OA device 110 taken through gain section 124 (i.e., through line a-a shown in FIG. 1).

As seen in FIG. 2A, in gain section 124, the relative values of w1 and w2 give rise to optical mode 216 such that its optical energy is contained within one continuous region that is substantially centrally located in composite waveguide 214. In other words, each of OA device 110 and coupling waveguide 112 partially supports optical mode 216.

In some embodiments, coupling waveguide 112 and active-material stack 210 are configured such that optical mode 216 extends over a continuous region that includes at least a portion of each of the active-material stack, the coupling waveguide, and silicon device layer 206 (i.e., optical mode 216 is partially supported by each of the active-material stack, the coupling waveguide, and the silicon device layer).

Coupler 128-1 is a section of active region 102 configured for forcing substantially all of the optical energy of light signal 118 located in active-material stack 210 into coupling waveguide 112 so that it can efficiently couple into passive waveguide 114. Coupler 128-1 includes tapers 126-1 and 126-2.

Taper 126-1 is a segment of active-material stack 210 that is configured to force the optical energy of light signal 118 into coupling waveguide 112. Taper 126-1 has length L1 and a width that reduces from w1 to zero (i.e., extinction) along length L1. In the depicted example, L1 is equal to 100 microns; however, it is typically within the range of approximately 50 microns to approximately 500 microns. It should be noted that the value of L1 is a matter of design choice and, therefore, it can have any suitable value. Furthermore, in some embodiments, taper 126-1 does not taper to extinction but, rather, to a non-zero width (e.g., one micron or less) that is sufficiently narrow to force the optical energy of light signal 118 from OA device 110 into passive waveguide 114.

In similar fashion, taper 126-2 is a segment of coupling waveguide 112 that is configured to facilitate the transfer of light signal 118 into passive waveguide 114 as a single-mode signal. Taper 126-2 has length L2, over which the width of coupling waveguide 112 changes from w2 to w4 (i.e., the width of passive waveguide 114). In the depicted example, L2 is equal to 50 microns; however, it is typically within the range of approximately 10 microns to approximately 500 microns. It should be noted that the value of L2 is not critical and, therefore, it can have any value within a wide range.

FIG. 2B depicts a schematic drawing of a sectional view of coupler 128-1 as taken through line b-b shown in FIG. 1.

As noted above, the distribution of the optical energy of optical mode 216 between active-material stack 210 and coupling layer 208 (i.e., the shape and vertical position of the optical mode) is based on the relationship of w1 and w2, which change along length L1 of taper 126-1. Tapers 126-1 and 126-2 are configured, therefore, to force optical mode 216 substantially completely into coupling waveguide 112 by the time light signal 118 reaches transition region 104.

In similar fashion, in the depicted example, w4 and w5 of passive waveguide 114 are selected such that optical mode 216 is substantially confined within its ridge and planar regions within transition region 104. In some embodiments, however, passive waveguide 114 is configured such that the optical energy of optical mode 216 extends across a continuous region that occupies at least portions of both passive waveguide 114 and silicon device layer 206. In other words, each of passive waveguide 114 and silicon device layer 206 partially supports optical mode 216.

FIG. 2C depicts a schematic drawing of a sectional view of transition region 104 as taken through line c-c shown in FIG. 1.

Coupler 128-2 is a section of output-coupling region 106 configured for efficiently optically coupling light signal 118 from passive waveguide 114 into silicon waveguide 116. Coupler 128-2 includes taper 126-3 and a segment of silicon waveguide 116, where taper 126-3 is a segment of passive waveguide 114 that is configured to facilitate the transfer of light signal 118 into silicon waveguide 116 as a single-mode signal.

FIG. 2D depicts a schematic drawing of a sectional view of coupler 128-2 as taken through line d-d shown in FIG. 1. Note that the planar portion of silicon waveguide 116 is not shown in FIG. 1.

Taper 126-3 has length L3, over which the width of passive waveguide 114 changes from w4 to extinction. As a result, taper 126-3 is configured to force optical mode 216 completely into silicon waveguide 116. In the depicted example, L3 is equal to 200 microns; however, it is typically within the range of approximately 50 microns to approximately 1000 microns. It should be noted that the value of L3 is a matter of design choice and, therefore, it can have any suitable value. As discussed above and with respect to taper 126-1, in some embodiments, taper 126-3 does not taper to extinction but, rather, to a non-zero width (e.g., one micron or less) that is sufficiently narrow to force the optical energy of light signal 118 from passive waveguide 114 into silicon waveguide 116. Furthermore, in some embodiments, silicon waveguide 116 includes a taper that facilitates transfer of optical energy between the silicon and passive waveguides. In some embodiments, both passive waveguide 114 and silicon waveguide 116 include a taper.

FIG. 2E depicts a schematic drawing of a sectional view of silicon waveguide 116 as taken through line e-e shown in FIG. 1. It should be noted that, in the depicted example, the regions between silicon waveguide 116 and taper 126-3 are air-cladding regions; however, these regions can be filled with any material suitable to function as cladding material for the silicon waveguide, such as silicon dioxide, silicon nitride, polymer, and the like.

It is another aspect of the present invention that OA device 110 can be configured to support an optical mode that is discontinuous such that, at some points within active region 102, it includes separate optical-mode portions that propagate together but are distributed among active-material stack 210 and coupling waveguide 114 and, in some embodiments, silicon device layer 206. In other words, each of active-material stack 210 and coupling waveguide 114 and silicon device layer 206 partially supports optical mode 216 by supporting a different one of its optical-mode portions.

FIG. 5A depicts a schematic drawing of a sectional view of an alternative composite waveguide in accordance with the present disclosure. The sectional view depicted in FIG. 5A is taken through a region analogous to that intersected by line a-a shown in FIG. 1. Composite waveguide 500 includes substrate 108, coupling waveguide 502, and active-material stack 504. For clarity, electrical contacts are not shown in FIG. 5A.

In composite waveguide 500, coupling waveguide 502 and active-material stack 504 are configured such that each includes at least one sub-layer that is configured to force optical energy of optical mode 216 into a different sub-layer of that element. As a result, optical mode 216 is split into two discontinuous optical-mode portions—optical-mode portions 216A and 216B. In other words, each of coupling waveguide 502 and active-material stack 504 partially supports optical mode 216 by supporting a different one of optical-mode portions 216A and 216B.

Coupling waveguide 502 is analogous to coupling waveguide 112; however, coupling waveguide 502 has width w8 and includes sub-layers 502A, 502B, and 502C, where each of sub-layers 502A and 502C has a refractive index that is lower than that of sub-layer 502B. As a result, sub-layers 502A and 502C function as lower and upper cladding layers, respectively, that substantially confine the bulk of the optical energy of optical-mode portion 216A to sub-layer 502B.

Active-material stack 504 is analogous to active-material stack 210; however, active-material stack 504 has width w7 and includes sub-layers 506A and 506B, each of which has a refractive index that is higher than that of gain layer 212. As a result, sub-layers 506A and 506B function as upper and lower cladding layers, respectively, that substantially confine the bulk of the optical energy of optical-mode portion 216B to the portion of active-material stack 504 that resides between them.

The widths of optical-mode portions 216A and 216B and the spacing between them are based upon widths w7 and w8 and the sub-layer configurations of coupling waveguide 502 and active-material stack 504.

In some embodiments, coupling waveguide 502 and active-material stack 504 are configured such that optical mode 216 includes a third optical-mode portion that is located in silicon device layer 206.

FIG. 5B depicts a schematic drawing of a sectional view of another alternative composite waveguide in accordance with the present disclosure. The sectional view depicted in FIG. 5B is taken through a region analogous to that intersected by line a-a shown in FIG. 1. Composite waveguide 508 is analogous to composite waveguide 500; however, in composite waveguide 508, coupling waveguide 502 and active-material stack 504 are configured to split the optical energy of optical mode 216 into three discontinuous optical-mode portions—optical-mode portions 216C, 216D, and 216E.

Coupling waveguide 510 is analogous to coupling waveguide 502; however, coupling waveguide 510 has width w10 and includes sub-layers 502D, 502E, and 502F, where each of sub-layers 502D and 502F has a refractive index that is lower than that of sub-layer 502E. As a result, sub-layers 502D and 502F function as lower and upper cladding layers, respectively, that substantially confine the bulk of the optical energy of optical-mode portion 216D to sub-layer 502E.

Active-material stack 512 is analogous to active-material stack 504; however, active-material stack 512 has width w9 and includes sub-layers 514A and 514B, each of which has a refractive index that is lower than that of gain layer 212. As a result, sub-layers 514A and 514B function as upper and lower cladding layers, respectively, that substantially confine the bulk of the optical energy of optical-mode portion 216C to the portion of active-material stack 512 that resides between them.

In the depicted example, coupling waveguide 510 and active-material stack 512 are further configured to give rise to additional optical-mode portion 216E, which is discontinuous with optical-mode portions 216C and 216D and substantially confined to silicon device layer 206.

As a result, each of coupling waveguide 510, active-material stack 512, and silicon device layer 206 partially supports optical mode 216 by supporting a different one of its optical-mode portions. The widths of optical-mode portions 216C, 216D, and 216E, as well as the spacing between them, are based upon widths w9 and w10 and the sub-layer configurations of coupling waveguide 510 and active-material stack 512.

In some embodiments, coupling layer 208 is configured such that optical mode 216 is split into discontinuous optical-mode portions in transition region 104, with one of the optical-mode portions being located in passive waveguide 112 and another optical-mode portion is located in silicon device layer 206.

Figure 6:
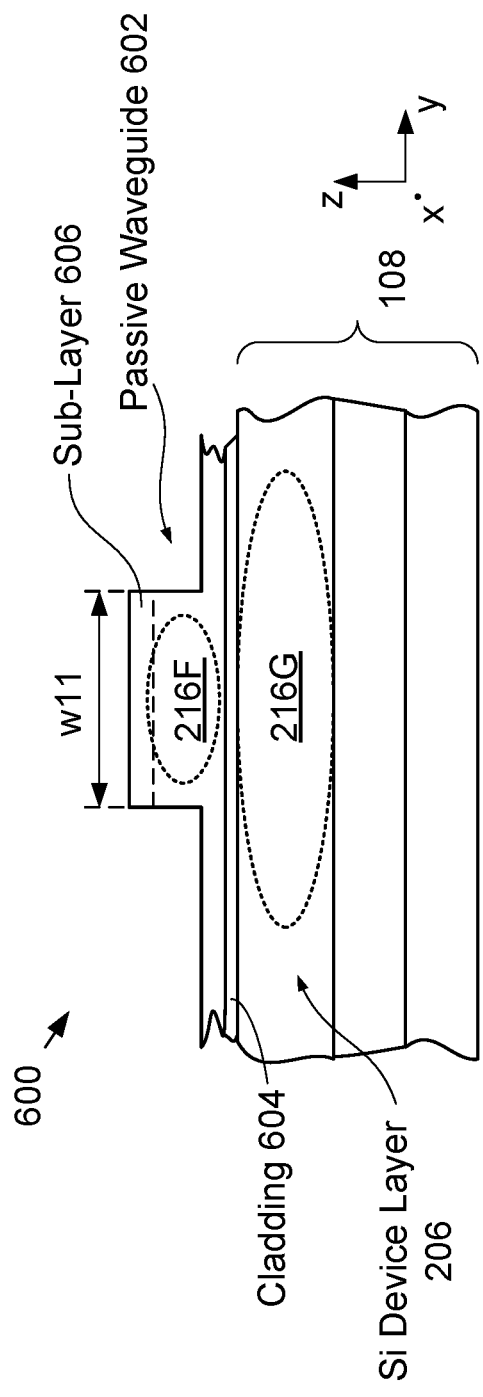
FIG. 6 depicts a schematic drawing of a sectional view of an alternative transition region in accordance with the present disclosure.

FIG. 6 depicts a schematic drawing of a sectional view of an alternative transition region in accordance with the present disclosure. The sectional view depicted in FIG. 6 is taken through a region analogous to that intersected by line c-c shown in FIG. 1. Transition region 600 includes substrate 108, passive waveguide 602, and cladding layer 604. Transition region 600 is analogous to transition region 104 described above; however, in transition region 600, optical mode 216 includes discontinuous optical-mode portions 216E and 216F, which reside in passive waveguide 602 and silicon device layer 206, respectively.

Passive waveguide 602 is analogous to passive waveguide 114; however, passive waveguide 602 includes sub-layer 606, which has a refractive index that is higher than the remainder of the passive waveguide.

Cladding 604 is a thin layer of material suitable for substantially blocking the passage of optical energy of light signal 118 between passive waveguide 114 and silicon device layer 206. In the depicted example, cladding 604 is a layer of silicon dioxide having a thickness of approximately 100 nm; however, it will be clear to one skilled in the art, after reading this Specification, how to specify, make, and use alternative embodiments wherein cladding 604 comprises a different material and/or has a different thickness.

As noted above, passive waveguide 602, cladding 604 and sub-layer 606 are configured such that they collectively support optical mode 216, which includes discontinuous optical-mode portions 216F and 216G, which are located in passive waveguide 114 and silicon device layer 206, respectively (i.e., passive waveguide 114 partially supports optical mode 216 by supporting optical-mode portion 216F and silicon device layer 206 partially supports optical mode 216 by supporting optical-mode portion 216G). The shapes, vertical positions, and separation between optical-mode portions 216F and 216G are based on the values of w11 that location.

Figure 7:
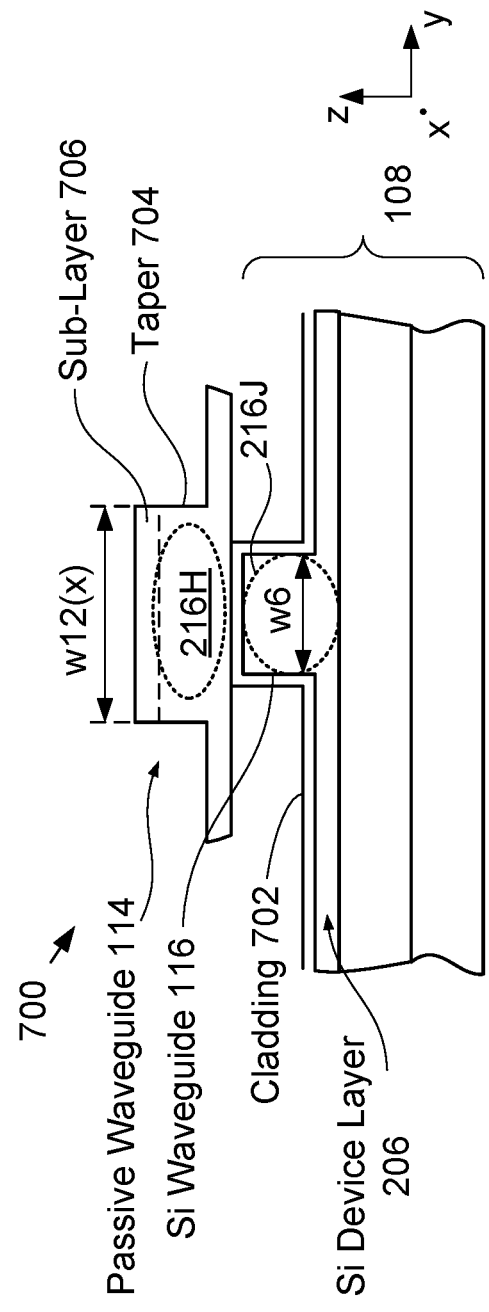
FIG. 7 depicts a schematic drawing of a sectional view of an alternative embodiment of a coupler for optically coupling a passive waveguide and a silicon waveguide in accordance with the present disclosure.

FIG. 7 depicts a schematic drawing of a sectional view of an alternative embodiment of a coupler for optically coupling a passive waveguide and a silicon waveguide in accordance with the present disclosure. The sectional view depicted in FIG. 7 is taken through a region analogous to that intersected by line d-d shown in FIG. 1. Coupler 700 includes substrate 108, silicon waveguide 116, cladding 702, and taper 704.

Cladding 702 is analogous to cladding 604.

Taper 704 is analogous to taper 126-3; however, taper 704 has width w12(x) along length L3 and includes sub-layer 706, which has a refractive index that is higher than the remainder of the taper. As a result, sub-layer 706 serves to confine optical energy of light signal 118 to the region of taper 704 located between cladding 702 and sub-layer 706.

By virtue of cladding 702 and sub-layer 706, optical mode 216 includes discontinuous optical-mode portions 216H and 216J, which are located in and supported by silicon waveguide 116 and taper 704, respectively. As a result, each of silicon waveguide 116 and taper 704 partially supports optical mode 216. The shapes, vertical positions, and separation between optical-mode portions 216H and 216J at any location along length L3 are based on the values of w12(x) and w6 at that location and the configuration of taper 704 and sub-layer 706.

In some embodiments, light signal 118 is optically coupled between passive waveguide 114 and silicon waveguide 116 via a turning reflector and vertical grating coupler.

FIG. 8 depicts a schematic drawing of a cross-sectional view of yet another alternative coupler in accordance with the present disclosure. Coupler 800 includes reflector 802 and vertical grating coupler 804.

Reflector 802 is an angled facet formed in passive waveguide 114. Reflector 802 is configured to receive light signal 118 propagating along longitudinal axis A1 of the passive waveguide and redirect it along a direction that is substantially normal to axis A1. In some embodiments, reflector 802 includes one or more surface layers (e.g., metals, dielectrics, etc.) for improving its reflectivity for light signal 118.

Grating 804 is a vertical grating coupler formed in silicon waveguide 116 and configured to receive light signal 118 from reflector 802 and redirect it along longitudinal axis A2 of the silicon waveguide.

As will be apparent to one skilled in the art, a vertical grating coupler typically has a range of angles at which light signal 118 can be received and successfully coupled into a waveguide. As a result, reflector 802 can be configured to redirect the light signal along any angle within the acceptance range of grating 804.

In some embodiments, grating 804 is formed in passive waveguide 114 and reflector 802 is formed in silicon waveguide 116.

In some embodiments, silicon waveguide includes an output port comprising a reflector configured to launch light signal 118 out of the plane of the silicon waveguide as a free-space signal.

FIGS. 9A-B depict schematic drawings of cross-sectional views of alternative output ports in accordance with the present disclosure. Each of ports 900 and 902 include reflector 904, which is formed in silicon waveguide 116.

Reflector 904 is analogous to reflector 802 described above; however, reflector 904 is formed in silicon waveguide 116 to redirect light signal 118 as indicated.

Port 900 includes reflector 904 and facet 906. Facet 906 is formed in silicon waveguide 116 such that light signal 118 is launched into free space and received by reflector 904. Reflector 904 is configured to redirect free-space light signal 118 away from handle substrate 202.

Port 902 includes reflector 904 is configured to launch light signal 118 as a free-space signal directed toward substrate 908.

Substrate 908 is analogous to substrate 108 described above; however, it is preferable that substrate 908 comprise a material that is substantially transparent and non-absorptive for the wavelengths of light signal 118 so that the light signal can pass completely through the substrate with little or no attenuation.

While it is preferable in most applications to optically couple light signal 118 between OA device 110 and silicon waveguide 116, in some embodiments, the light signal is provided to, or received from, an external device or system without being coupled into the silicon waveguide.

Figure 10:
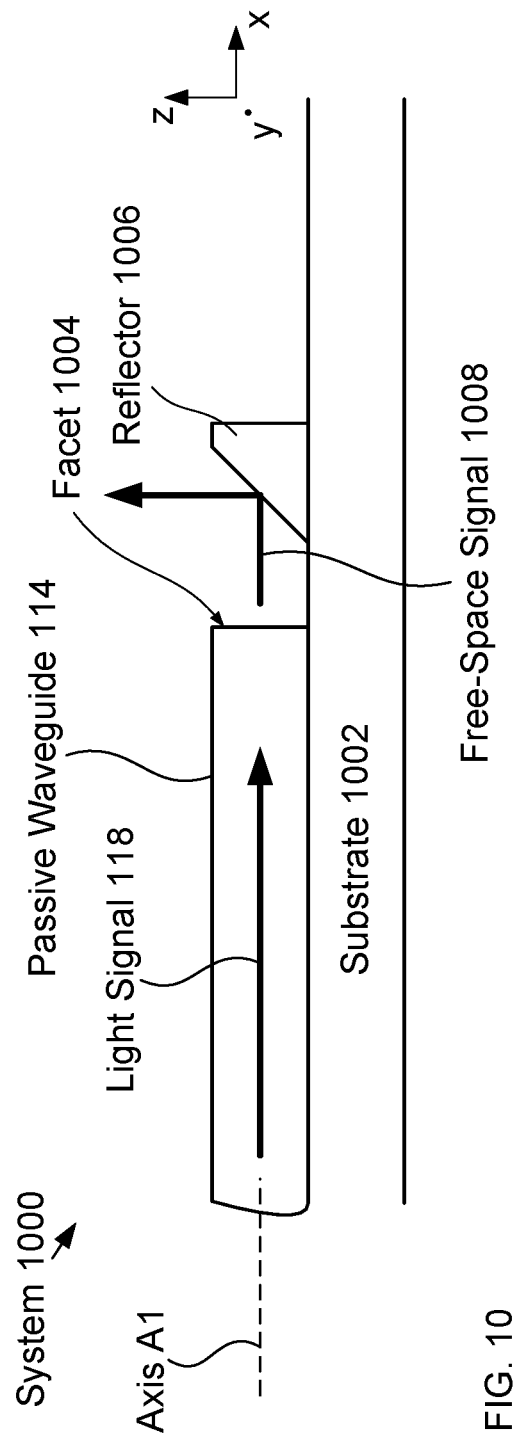
FIG. 10 depicts a schematic drawing of an alternative system in accordance with the present disclosure.

FIG. 10 depicts a schematic drawing of a cross-sectional view of an alternative system in accordance with the present disclosure. System 1000 is analogous to system 100; however, in system 1000, light signal 118 is launched into free space directly from passive waveguide 114. System 1000 is disposed on substrate 1002 and includes facet 1004 and bulk reflector 1006.

Substrate 1002 is a bulk silicon substrate suitable for use in planar processing.

Facet 1004 is an end facet formed in passive waveguide 114 in conventional fashion (e.g., by etching, dicing, partial dicing, etc.). At facet 1004, light signal 118 exits the passive waveguide as free-space signal 1008.

Reflector 1006 is analogous to reflector 804; however, reflector 1006 is a bulk reflector mounted on substrate 1002 such that it receives free-space signal 1008 from passive waveguide 114. In some embodiments, reflector 1006 is formed in a region of coupling layer 208 outside of the area of passive waveguide 114.

In some embodiments, it is preferable to precisely locate a bulk optical element to receive free-space signal 1008 directly from passive waveguide 114.

Figure 11:
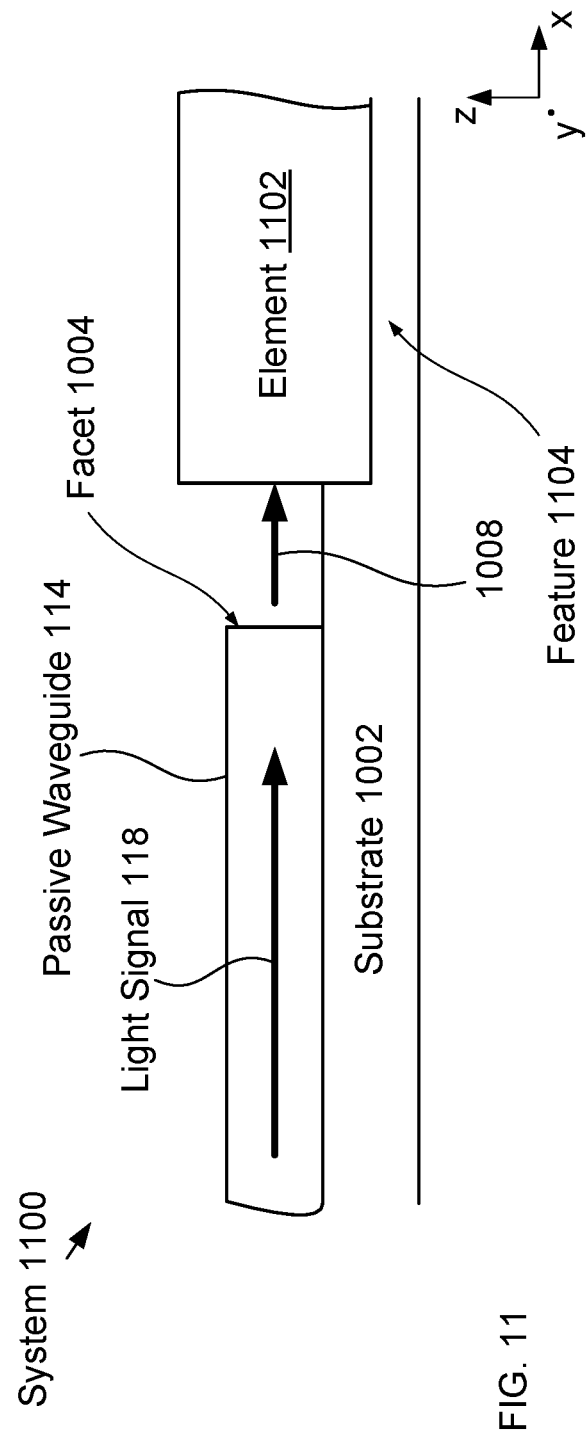
FIG. 11 depicts a schematic drawing of a cross-sectional view of another alternative system in accordance with the present disclosure.

FIG. 11 depicts a schematic drawing of a cross-sectional view of another alternative system in accordance with the present disclosure. System 1100 is analogous to system 1000; however, system 1100 includes bulk optical element 1102 and alignment feature 1104. Element 1102 is precisely located on substrate 1002 by alignment feature 1104 such that it receives light signal 118 from passive waveguide 114.

In the depicted example, element 1102 is an optical fiber; however, element 1102 can include a wide range of device and systems without departing from the scope of the present disclosure. Devices and systems suitable for use in element 1102 include, without limitation, optical fibers, PICs, photodetectors, light sources (edge-emitting lasers, vertical-cavity surface-emitting lasers (VCSELs), light-emitting diodes, integrated-optics systems, planar-lightwave circuits (PLCs), and the like.

Alignment feature 1104 is a channel etched in substrate 1002 via conventional methods (e.g., reactive-ion etching, crystallographic-dependent etching, ion milling, laser-assisted etching, etc.) such that its depth aligns the core of element 1102 with passive waveguide 114. In some embodiments, alignment feature 1104 includes at least one projection disposed on the top surface of substrate 1002 (or silicon device layer 206 in embodiments where system 1100 is disposed on an SOL such as substrate 108), where the projection is configured to constrain element 1102 in at least one dimension.

It should be noted that, although the illustrative embodiment is an integrated-optics-based, silicon-waveguide-coupled laser wherein light is generated in an optically active device and propagates to a waveguide port, embodiments in accordance with the present disclosure include systems wherein a light signal is coupled into a waveguide port and conveyed to an OA device. Furthermore, in some embodiments, no silicon waveguide is included and port 120 is located in passive waveguide 114. Furthermore, in some embodiments, more than one passive waveguide and/or silicon waveguide is included.

Including a narrow taper and/or sharp point in one or both waveguide layers of a coupler enables efficient transfer of light between them, can reduce the length of a coupler, and/or mitigate reflections; however, their fabrication using conventional lithography and dry etching can be challenging.

Alternative methods for forming tapers includes the formation of a relatively blunt feature using lithography and dry etching, followed by a wet etch (often a crystallographic-dependent etch) to refine the blunt feature into the desired shape. Unfortunately, wet etches can be notoriously difficult to control and extremely precise exposure times are often required to avoid under or over etching the feature. Furthermore, material and/or layer properties (e.g., material density, layer thickness, residual stress, etc.) can vary across the surface of a wafer giving rise to variations in etch results.

It is an aspect of the present disclosure that the inclusion of etch-stop layers at key points in a layer structure can significantly improve fabrication of waveguide couplers, as well as other critical features.

Figure 12:
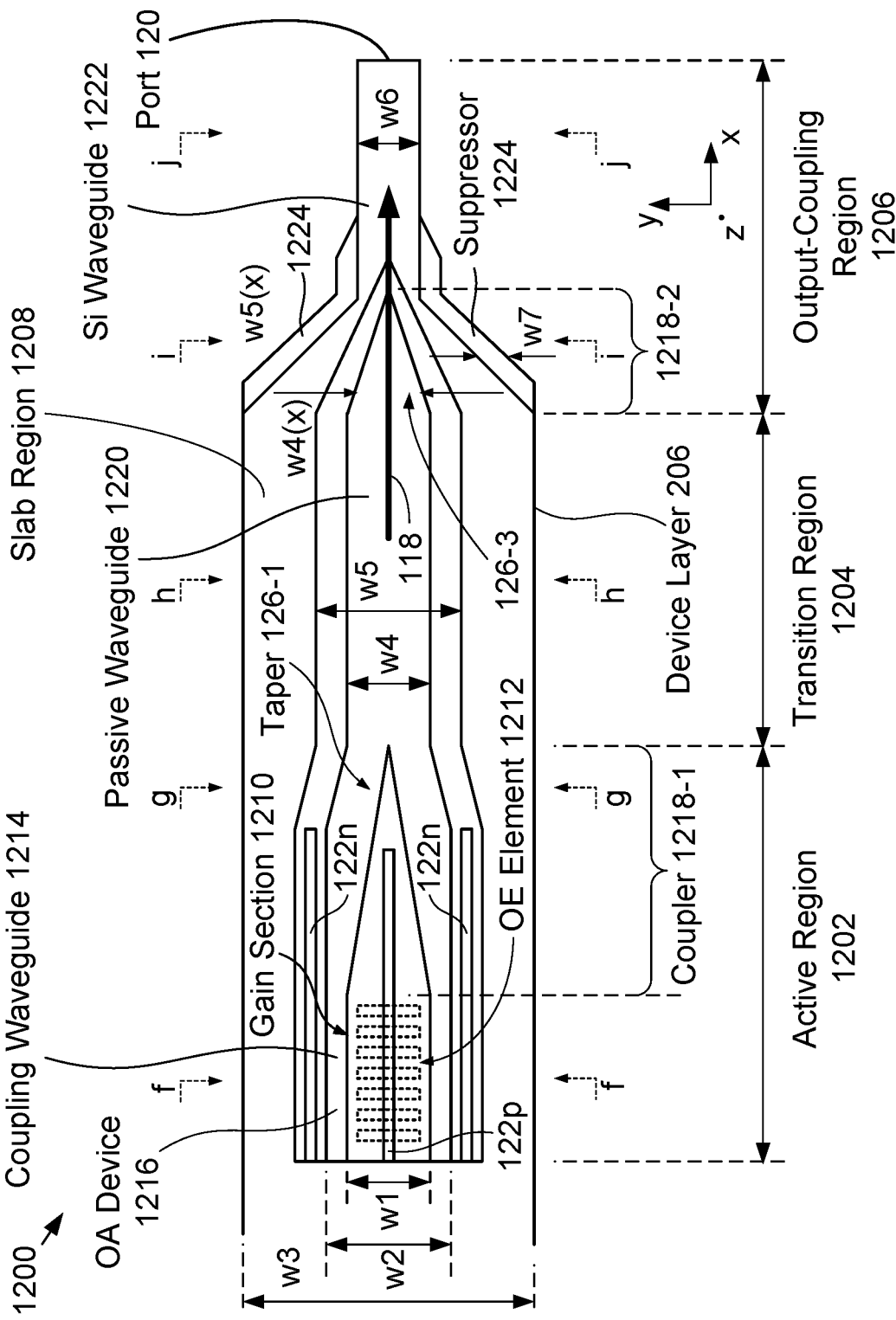
FIG. 12 depicts a schematic drawing of a top view of yet another alternative embodiment of an integrated-optics system in accordance with the present disclosure.
Figure 13A:
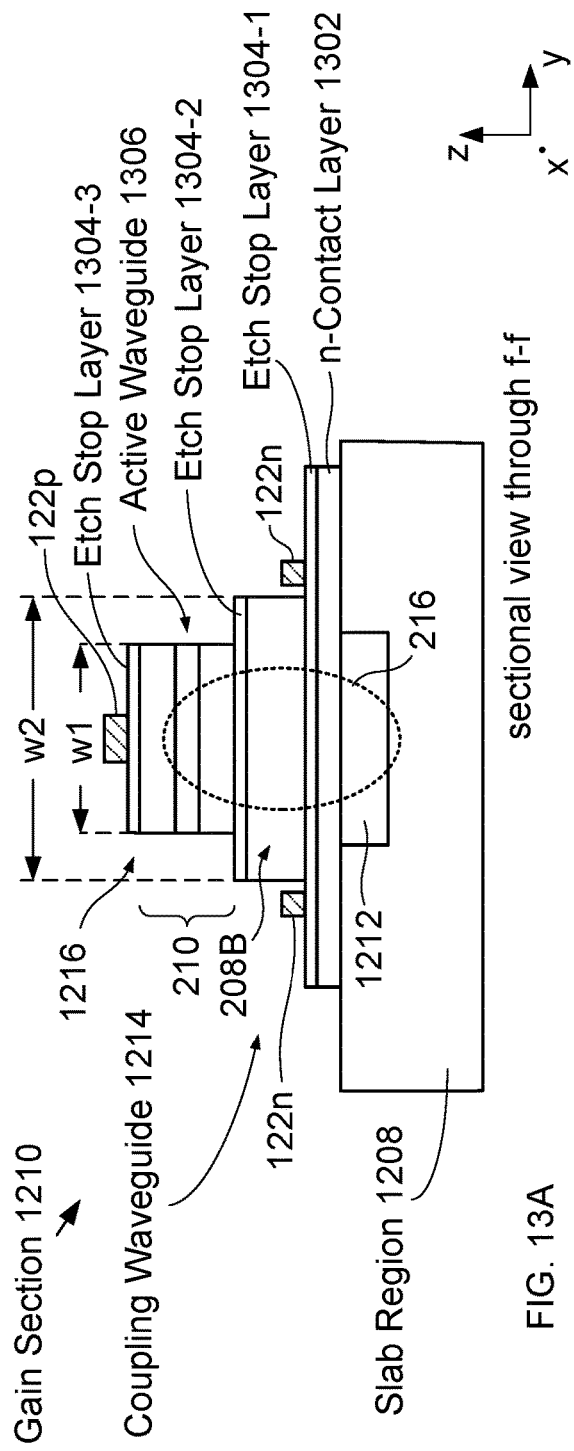
Figure 13B:
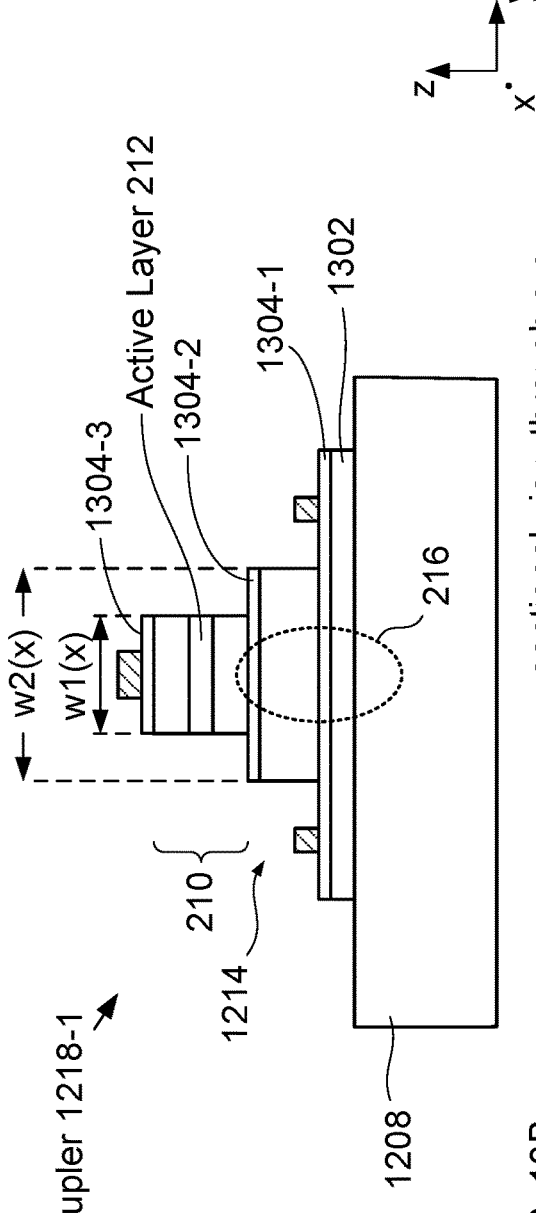

FIG. 12 depicts a schematic drawing of a top view of yet another alternative embodiment of an integrated-optics system in accordance with the present disclosure. System 1200 is analogous to system 100 and includes active region 1202, transition region 1204, and output-coupling region 1206, which are disposed on substrate 108.

FIGS. 13A-E depict schematic drawings of sectional views of system 1200 through lines f-f through j-j, respectively.

Figure 14:
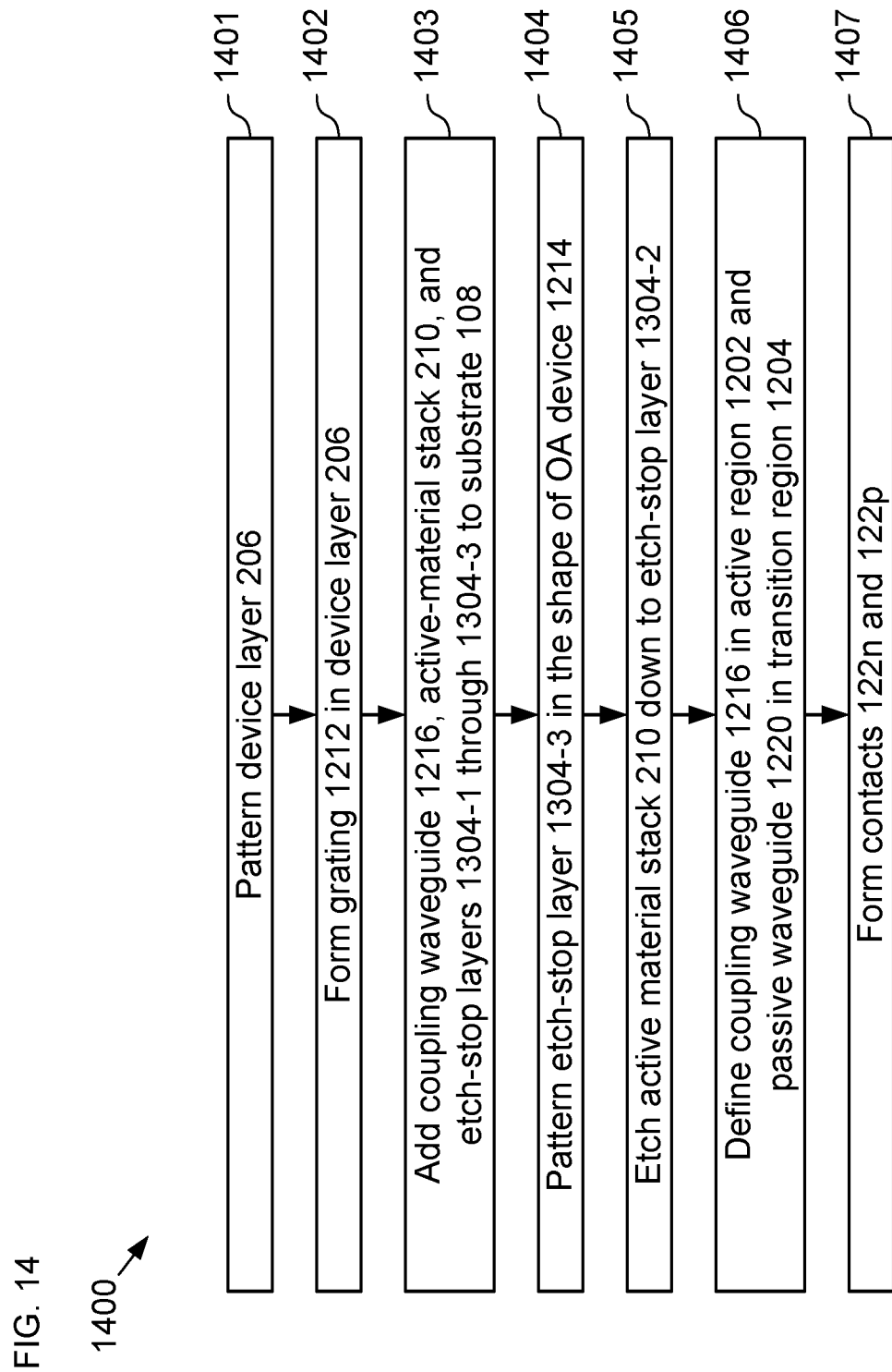
FIG. 14 depicts operations of a method suitable for forming system 1200 in accordance with the present disclosure.

FIG. 14 depicts operations of a method suitable for forming system 1200 in accordance with the present disclosure. Method 1400 begins with operation 1401, wherein device layer 206 is patterned to define slab region 1208 and silicon waveguide 1222.

At operation 1402, optical element 1212 is formed in device layer 206 within active region 1202.

Optical element 1212 is typically formed by etching features into slab region 1208 and filling them with material having a refractive index that is different than that of silicon. In the depicted example, optical element 1212 is a diffraction grating whose gaps are regions of silicon dioxide and whose grating elements are the unetched silicon between the gaps. In some embodiments, features of optical element 1212 are formed during operation 1401 during the patterning of device layer 206 to define the slab region and silicon waveguide. In some embodiments optical element 1212 can be configured to provide vertical confinement of the optical mode from below.

At operation 1403, coupling waveguide 1214, active-material stack 210, and etch-stop layers 1304-1 through 1304-3 are added to substrate 108, as described above and with respect to operation 302 of method 300. As discussed above, in some embodiments, these layers are added to substrate 108 via heteroepitaxial growth. In some embodiments, these layers are added to the substrate via a hybrid-bonding approach such as that described above. In the depicted example, active-material stack 210 includes gain layer 212, which functions as active waveguide 1306.

Coupling waveguide 1214 includes n-contact layer 1302, etch stop layer 1304-1, and coupling layer portion 208B, which are collectively analogous to coupling waveguide 208 described above.

N-contact layer 1302 is analogous to sub-layer 208A of coupling layer 208. In the depicted example, N-contact layer 1302 is a layer of gallium arsenide that is doped to reduce its refractive index and increase its conductivity.

Each of etch-stop layers 1304-1 through 1304-3 is a thin layer of material suitable for functioning as an etch stop during the patterning of the material residing on it. In the depicted example, etch-stop layer 1304-1 is a very thin layer of aluminum gallium arsenide (AlGaAs). As will be apparent to one skilled in the art, however, myriad material choices exist for etch-stop layers suitable for use with the constituent layers of compound semiconductor devices. For example, AlGaAs, indium aluminum phosphide (InAlP), indium gallium aluminum phosphide, and the like, are all suitable stop-etch materials suitable for use while etching GaAs, GaAs is a suitable stop-etch material for use while etching AlGaAs, and so on.

At operation 1404, etch-stop layer 1304-3 is patterned to define the lateral dimensions of gain section 1210 and taper 126-1. Gain section 1210 is analogous to gain section 124 described above. The shape of gain section 1210 determines the shape of OA device 1216. In some embodiments, the shape of taper 126-1 is based on at least one crystal plane of the materials of active-material stack 210.

In some embodiments, an etch stop layer is included on top of gain layer 212. In some embodiments, an etch stop layer is included below gain layer 212 such that the gain layer is disposed on the etch-stop layer.

At operation 1405, active-material stack 210 is etched in a suitable etchant down to etch-stop layer 1304-2. During operation 1405, etch-stop layer 1304-3 protects the top surface of active-material stack 210, enabling its shape to be defined with very high fidelity with respect to the mask used to pattern etch-stop layer 1304-3. Preferably, the edges of the etched structure are protected during operation 1405 to mitigate etchant attack on the sidewalls of active-material stack 210 as the etch proceeds.

In some embodiments, the etchant used in operation 1405 is a crystallographic-dependent etch that stops on specific crystal planes in active-material stack 210 to define the sidewalls of taper 126-1. In some embodiments, a dry etch is used in operation 1405. in some embodiments, a wet etch is used in operation 1405.

In some embodiments, at least one layer of active-material stack 210 and/or coupling waveguide 1214 includes a graded material composition that enables a specific vertical etch profile to be realized when patterning the layer(s).

The patterning of active-material stack 210 realizes active region 1202 as being analogous to active region 102; however, active region 1202 includes optical element 1212 located in device layer 206 beneath OA device 1216 to collectively define a DFB laser.

It is another aspect of the present disclosure that the portion of active-material stack located in the region of coupler 1218-1 (i.e., its tapered portion) functions as an optical amplifier for the light generated within the DFB laser cavity.

It should be noted that, although the depicted example includes a diffraction grating optically coupled with active-material stack 210 to give rise to a DFB laser, any practical grating structure can be used within a gain cavity or as a mirror that defines at least one end of a gain cavity of any suitable laser (e.g., distributed Bragg reflector (DBR) laser, coupled-cavity (CC) laser, etc.) without departing from the scope of the present disclosure. Examples of alternative gratings suitable for use in accordance with the present disclosure include, without limitation, windowed sampled gratings (WSG), binary superstructure gratings (BSG), binary superimposed gratings, and the like, some of which are described in U.S. Non-Provisional patent application Ser. No. 17/465,403, which is incorporated herein by reference.

Furthermore, in some embodiments, optical element 1212 is formed by patterning device layer 206 or active-material stack 210, rather than by defining it in device layer 206, as also described in detail in U.S. Non-Provisional patent application Ser. No. 17/465,403.

Still further, although the depicted example includes a Bragg grating within active region 1202, it will be clear to one skilled in the art, after reading this Specification, how to specify, make, and use alternative embodiments in which an optical element other than a Bragg grating is included in active region 1202. Alternative optical elements suitable for use in accordance with the present disclosure include, without limitation, photonic crystals, optically resonant cavities, holograms, and the like.

At operation 1406, the lateral dimensions of coupling waveguide 1214 are defined in each of active region 1202 and transition region 1204. Typically, coupling waveguide 1214 is patterned in a multi-step process that begins by patterning etch-stop layer 1304-2 such that it has the desired lateral dimensions of the ridge portion of coupling waveguide 1214. Once etch-stop layer 1304-2 is patterned, the material of sub-layer 208B is etched in a suitable etchant that stops on etch-stop layer 1304-1. The exposed etch-stop layer 1304-1 is then patterned to define the lateral dimensions of the slab portion of coupling waveguide 1214, followed by etching the material of n-contact layer 1302.

In some embodiments, one or both of sub-layer 208B and n-contact layer 1302 is etched using a crystallographic-dependent etch that stops on specific crystal planes in their material. In some embodiments, a dry etch is used to pattern one or both of sub-layer 208B and n-contact layer 1302. In some embodiments, a wet etch is used to pattern one or both of sub-layer 208B and n-contact layer 1302.

It should be noted that, in the prior art, the compound-semiconductor features of integrated-optics systems have been subject to significant damage because these features extend past the lateral extent of underlying silicon features, creating channels in which wet-etch chemicals can flow. This has led to undercutting of the compound-semiconductor features, deposition of debris, and the like.

It is an aspect of the present disclosure, however, that, in some embodiments, no compound semiconductor feature extends past the lateral dimensions of slab region 1208 or silicon waveguide 1222 at any point. As a result, undercutting of these features is avoided entirely. In some embodiments, the perimeter of the compound-semiconductor material is supported by silicon material of silicon device layer 206 (e.g., regions of slab region 1208 or silicon waveguide 1222). In some embodiments, at least a portion of the compound-semiconductor material is supported by silicon dioxide (or another suitable material) that has been formed to backfill an etched region of device layer 206.

Such an arrangement of materials is enabled by the fact that, in accordance with the present disclosure, silicon waveguide 1222 only guides light in output-coupling region 1206, which includes coupler 1218-2 and silicon waveguide 1222.

At operation 1407 contacts 122n and 122p are formed as discussed above.

As noted above, the active-waveguide layers of active-material stack 210 and optical element 1212 collectively define OE device 1216 as a DFB laser. In gain section 1210, optical mode 216 is contiguous and existent in active waveguide 1306, coupling waveguide 1214, and optical element 1212. In addition, coupling waveguide 1214 transitions to passive waveguide 1220 along the length of coupler 1218-1 (i.e., coupling waveguide 1214 and passive waveguide 1220 are contiguous sections of coupling layer 208 that abut where active region 1202 and transition region 1204 meet).

Slab region 1208 has two distinct portions, a first portion on which coupling waveguide 1214 is disposed, and a second portion on which no compound semiconductor material is disposed. In the depicted example, device layer 208 is configured such that it does not laterally confine light (i.e., it does not confine light along directions parallel to the plane of substrate 108) in the second portion. In other words, lateral confinement of an optical mode existent in both slab region 1208 and coupling waveguide 1214 only arises from the lateral confinement provided by the coupling waveguide (and active-material stack 210 when it is also present).

At coupler 1218-1, widths w1(x) and w2(x) become narrower along the x-direction, which drives optical mode 216 out of active waveguide 1306 such that the optical mode is distributed across coupling waveguide 1214 and slab region 1208.

In transition region 1204, optical mode 216 propagates toward port 120 as a contiguous optical mode that extends over coupling waveguide 1214 and slab region 1208.

At coupler 1218-2, widths w4(x) and w5(x) become narrower along the x-direction, which drives optical mode 216 into silicon waveguide 1222 such that the optical mode resides substantially completely in silicon waveguide 1222 by the time it reaches output-coupling region 1206.

It is another aspect of the present disclosure that any of the etch steps included in method 1400 can be performed in a two-step process in which a substantially "coarse" mask pattern is first formed (e.g., in an etch-stop layer) and then transferred into the layer to be patterned using a first etch. Once the coarse shape of the patterned layer is formed, a second etch comprising a crystallographic dependent etchant is used to refine the shape of the patterned layer such that at least one sidewall of the patterned layer is defined by a crystal plane of its material. Such a two-step formation process enables definition of sharper and/or narrower features than can be formed using conventional etching methods known in the prior art.

In some embodiments, at least one of active-material stack 210, coupling waveguide 1214, and silicon waveguide 1222 is configured such that optical mode 216 includes multiple optical-mode portions that are discontinuous, as discussed in the parent application.

As noted above, in order to avoid trapping etchant chemicals and residue beneath the compound-semiconductor structures, at each point along the x-direction, silicon material extends past the edges of passive waveguide 1220. In addition, it is yet another aspect of the present disclosure that, within coupler 1218-2, silicon waveguide 1222 is configured such that, as optical mode 216 transitions from passive waveguide 1220 fully into the silicon waveguide via coupler 1218-2, higher-order modes (e.g., optical modes excited due to misalignment of the compound-semiconductor features to the silicon features, excited by finite taper-tip widths, emission from OE 1212, etc.) are suppressed in light signal 118.

In the depicted example, radiation of higher-order modes out of light signal 118 is enabled by the inclusion of mode suppressors 1224 in coupler 1218-2. Mode suppressors 1224 are silicon "slab-waveguide" regions having width w7, which are optically coupled with silicon waveguide 1222 such that the optical energy of the higher-order modes can couple into them.

Mode suppressors 1224 are features etched into device layer 206 to an intermediate depth d1 along the length of coupler 1218-2. After a length sufficient to enable a desired level of suppression, the width, w7, of suppressors 1224 reduces to zero at a point past the end of coupler 1218-2 by etching the device layer to depth d2, which is deeper than d1. In the depicted example, depth d2 is equal to the full thickness of device layer 206, thereby terminating suppressors 1224. In some embodiments, depth d2 is less than the complete thickness of the device layer. By virtue of the inclusion of suppressors 1224, coupling of the higher-order modes into output port 120 via silicon waveguide 1222 is mitigated.

Typically, the width of suppressors 1224 reduces to zero width after the end of coupler 1218-2 in order to enable optical routing in a higher confinement waveguide. However, in some embodiments, some portion of the width of the suppressors remains beyond the extent of coupler 1218-2. In some embodiments, suppressors 1224 are configured to have additional functionality, such as high-confinement structures that enable tighter waveguide bends, higher waveguide density, or to form other photonic elements (e.g., ring resonators, power splitters, etc.).

It is to be understood that the disclosure teaches only examples of embodiment in accordance with the present disclosures and that many variations of these embodiments can easily be devised by those skilled in the art after reading this disclosure and that the scope of the present invention is to be determined by the following claims.

What is claimed is:

1. An integrated-optics system disposed on a substrate that defines a first plane, the system comprising:
    (1) an optically active device that is selectively located in a first region of the substrate, wherein the optically active device includes:
        (a) a coupling waveguide that includes a first layer disposed on a contact layer, the first layer comprising a first compound semiconductor and the contact layer comprising a second compound semiconductor, wherein the coupling waveguide at least partially supports a first optical mode of a light signal, and wherein the coupling waveguide further includes a first etch-stop layer that is located between the first layer and the contact layer, the etch stop layer comprising a first material that has a first etch rate in a first etch, and wherein the first compound semiconductor has a second etch rate in the first etch, and further wherein the first etch rate is slower than the second etch rate; and
        (b) an active-material stack comprising a third compound semiconductor, the active-material stack being disposed on the coupling waveguide;
        wherein the active-material stack and the coupling waveguide collectively define a composite waveguide that at least partially supports the first optical mode; and
    (2) a silicon layer that includes a silicon waveguide that is selectively located in a second region of the substrate, the silicon waveguide being configured to at least partially support the first optical mode; and
    wherein the coupling waveguide extends from the first region to a second taper located in the second region, the second taper being configured to optically couple the first optical mode from the composite waveguide into the silicon waveguide.

2. The system of claim 1 wherein the second taper includes at least one sidewall that is defined by a crystal plane of the first compound semiconductor.

3. The system of claim 1 further including (3) a second etch-stop layer, wherein the coupling waveguide is disposed on the second etch-stop layer, and wherein the second etch stop layer comprises a second material that has a third etch rate in a second etch, and wherein the first compound semiconductor has a fourth etch rate in the second etch and the second compound semiconductor has a fifth etch rate in the second etch, and further wherein the third etch rate is slower than each of the fourth and fifth etch rates.

4. The system of claim 3 wherein the coupling waveguide includes at least one sidewall that is defined by a crystal plane of the first compound semiconductor.

5. The system of claim 1 further including (3) a second etch-stop layer, wherein the active-material stack includes a gain layer that is in direct physical contact with the second etch-stop layer.

6. The system of claim 5 wherein the gain layer comprises a fourth compound semiconductor and includes at least one sidewall that is defined by a crystal plane of the fourth compound semiconductor.

7. The system of claim 1 further including (3) a second etch-stop layer, wherein the active-material stack includes a cladding layer and a gain layer that includes at least one quantum element that is selected from the group consisting of a quantum dot, a quantum well, a quantum dash, and a quantum wire, and wherein the second etch-stop layer is between the cladding layer and the gain layer.

8. The system of claim 7 wherein the gain layer comprises a fourth compound semiconductor and includes at least one sidewall that is defined by a crystal plane of the fourth compound semiconductor.

9. The system of claim 1 wherein the silicon layer is configured such that it has a first portion that defines the silicon waveguide, a second portion on which the coupling waveguide is disposed, and a third portion on which the coupling waveguide is not disposed, wherein the second portion and the coupling waveguide collectively provide light confinement in a first direction that is parallel to the first plane, and wherein the third portion confines light in only a second direction that is orthogonal to the first plane.

10. The system of claim 1 wherein the coupling waveguide has a bottom surface, and wherein the entirety of the bottom surface is in physical contact with silicon or silicon dioxide.

11. The system of claim 1 wherein the second taper and the silicon waveguide collectively define a first coupler, and wherein the silicon waveguide is configured to enable radiation of a second optical mode having a higher order than the first optical mode away from the first coupler.

12. The system of claim 1 further comprising (3) an optical element that is optically coupled with the active-material stack.

13. The system of claim 12 wherein the optical element and active-material stack collectively define a laser selected from the group consisting of a distributed feedback (DFB) laser, a distributed Bragg reflector (DBR) laser, and a coupled-cavity laser.

14. The system of claim 12 wherein the optical element is configured as a mirror for partially defining a laser cavity in the active-material stack.

15. An integrated-optics system disposed on a substrate, the system having a first region, a second region, and a third region, the system including:
    a coupling waveguide that resides in the second region and extends from the first region to the third region, the coupling waveguide including a first layer disposed on a contact layer, the first layer comprising a first compound semiconductor and the contact layer comprising a second compound semiconductor, wherein the coupling waveguide at least partially supports a first optical mode of a light signal;
    an optically active device that includes an active-material stack comprising a third compound semiconductor, the active-material stack being disposed on the coupling waveguide to collectively define a composite waveguide that at least partially supports the first optical mode, wherein the optically active device is located only in the first region; and
    a silicon layer comprising a silicon waveguide in the third region, the silicon waveguide being configured to at least partially support the optical mode, wherein the silicon waveguide is optically coupled with the active-material stack via the coupling waveguide.

16. The system of claim 15 wherein the coupling waveguide further includes an etch-stop layer comprising a first material that has a first etch rate in a first etch, the first compound semiconductor having a second etch rate in the first etch that is faster than the first etch rate, and wherein the etch-stop layer is located either (i) between the first layer and the contact layer or (ii) beneath the contact layer such that the coupling waveguide is disposed on the etch-stop layer.

17. The system of claim 15 wherein the silicon layer is configured such that it has a first portion that defines the silicon waveguide, a second portion on which the coupling waveguide is disposed, and a third portion on which the coupling waveguide is not disposed, wherein the second portion and the coupling waveguide collectively provide light confinement in a first direction that is parallel to the first plane, and wherein the third portion confines light in only a second direction that is orthogonal to the first plane.

18. An integrated-optics system disposed on a first substrate, the system including:
   a coupling waveguide that at least partially supports a first optical mode of a light signal, the coupling waveguide including a first layer disposed on a contact layer, the first layer comprising a first compound semiconductor and the contact layer comprising a second compound semiconductor, wherein the coupling waveguide is located in a first region of the substrate and a second region of the substrate that abuts the first region;
   an optically active device that includes an active-material stack comprising a third compound semiconductor, the active-material stack being disposed on the coupling waveguide to collectively define a composite waveguide that at least partially supports the first optical mode, wherein the optically active device is located only in the first region; and
   an output port that is located outside the first region;
   wherein the output port is optically coupled with the active-material stack via the coupling waveguide.

19. The system of claim 18 wherein the coupling waveguide includes the output port.

20. The system of claim 18 further comprising a silicon layer comprising a silicon waveguide in a third region of the substrate, the silicon waveguide being configured to at least partially support the optical mode, wherein the silicon waveguide includes the output port, and wherein the output port is optically coupled with the active-material stack via the coupling waveguide and the silicon waveguide.

21. The system of claim 18 wherein the coupling waveguide further includes an etch-stop layer comprising a first material that has a first etch rate in a first etch, the first compound semiconductor having a second etch rate in the first etch that is faster than the first etch rate, and wherein the etch-stop layer is located either (i) between the first layer and the contact layer or (ii) beneath the contact layer such that the coupling waveguide is disposed on the etch-stop layer.

22. An integrated-optics system disposed on a substrate that defines a first plane, the system comprising:
   (1) an optically active device that is selectively located in a first region of the substrate, wherein the optically active device includes:
      (a) a coupling waveguide that includes a first layer disposed on a contact layer, the first layer comprising a first compound semiconductor and the contact layer comprising a second compound semiconductor, wherein the coupling waveguide at least partially supports a first optical mode of a light signal; and
      (b) an active-material stack comprising a third compound semiconductor, the active-material stack being disposed on the coupling waveguide;
      wherein the active-material stack and the coupling waveguide collectively define a composite waveguide that at least partially supports the first optical mode; and
   (2) a silicon layer that includes a silicon waveguide that is selectively located in a second region of the substrate, the silicon waveguide being configured to at least partially support the first optical mode; and
   (3) a first etch-stop layer, wherein the coupling waveguide is disposed on the first etch-stop layer, and wherein the first etch stop layer comprises a first material that has a first etch rate in a first etch, and wherein the first compound semiconductor has a second etch rate in the first etch and the second compound semiconductor has a third etch rate in the first etch, and further wherein the first etch rate is slower than each of the second and third etch rates;
   wherein the coupling waveguide extends from the first region to a second taper located in the second region, the second taper being configured to optically couple the first optical mode from the composite waveguide into the silicon waveguide.

23. The system of claim 22 wherein the coupling waveguide includes at least one sidewall that is defined by a crystal plane of the first compound semiconductor.

24. The system of claim 22 further including (4) a second etch-stop layer, wherein the active-material stack includes a gain layer that is in direct physical contact with the second etch-stop layer.

25. The system of claim 24 wherein the gain layer comprises a fourth compound semiconductor and includes at least one sidewall that is defined by a crystal plane of the fourth compound semiconductor.

26. The system of claim 22 wherein the silicon layer is configured such that it has a first portion that defines the silicon waveguide, a second portion on which the coupling waveguide is disposed, and a third portion on which the coupling waveguide is not disposed, wherein the second portion and the coupling waveguide collectively provide light confinement in a first direction that is parallel to the first plane, and wherein the third portion confines light in only a second direction that is orthogonal to the first plane.

27. The system of claim 22 wherein the coupling waveguide has a bottom surface, and wherein the entirety of the bottom surface is in physical contact with silicon or silicon dioxide.

28. The system of claim 22 wherein the second taper and the silicon waveguide collectively define a first coupler, and wherein the silicon waveguide is configured to enable radiation of a second optical mode having a higher order than the first optical mode away from the first coupler.

29. The system of claim 22 further comprising (3) an optical element that is optically coupled with the active-material stack.

30. The system of claim 29 wherein the optical element and active-material stack collectively define a laser selected from the group consisting of a distributed feedback (DFB) laser, a distributed Bragg reflector (DBR) laser, and a coupled-cavity laser.

31. The system of claim 29 wherein the optical element is configured as a mirror for partially defining a laser cavity in the active-material stack.

32. An integrated-optics system disposed on a substrate that defines a first plane, the system comprising:
   (1) an optically active device that is selectively located in a first region of the substrate, wherein the optically active device includes:
      (a) a coupling waveguide that includes a first layer disposed on a contact layer, the first layer comprising a first compound semiconductor and the contact layer comprising a second compound semiconductor, wherein the coupling waveguide at least partially supports a first optical mode of a light signal; and (b) an active-material stack comprising a third compound semiconductor, the active-material stack being disposed on the coupling waveguide;

wherein the active-material stack and the coupling waveguide collectively define a composite waveguide that at least partially supports the first optical mode; and (2) a silicon layer that includes a silicon waveguide that is selectively located in a second region of the substrate, the silicon waveguide being configured to at least partially support the first optical mode; and (3) an etch-stop layer;

wherein the active-material stack includes a cladding layer and a gain layer that includes at least one quantum element that is selected from the group consisting of a quantum dot, a quantum well, a quantum dash, and a quantum wire, and wherein the etch-stop layer is between the cladding layer and the gain layer; and wherein the coupling waveguide extends from the first region to a second taper located in the second region, the second taper being configured to optically couple the first optical mode from the composite waveguide into the silicon waveguide.

33. The system of claim 32 wherein the coupling waveguide includes at least one sidewall that is defined by a crystal plane of the first compound semiconductor.

34. The system of claim 32 wherein the gain layer is in direct physical contact with the etch-stop layer.

35. The system of claim 34 wherein the gain layer comprises a fourth compound semiconductor and includes at least one sidewall that is defined by a crystal plane of the fourth compound semiconductor.

36. The system of claim 32 wherein the silicon layer is configured such that it has a first portion that defines the silicon waveguide, a second portion on which the coupling waveguide is disposed, and a third portion on which the coupling waveguide is not disposed, wherein the second portion and the coupling waveguide collectively provide light confinement in a first direction that is parallel to the first plane, and wherein the third portion confines light in only a second direction that is orthogonal to the first plane.

37. The system of claim 32 wherein the coupling waveguide has a bottom surface, and wherein the entirety of the bottom surface is in physical contact with silicon or silicon dioxide.

38. The system of claim 32 wherein the second taper and the silicon waveguide collectively define a first coupler, and wherein the silicon waveguide is configured to enable radiation of a second optical mode having a higher order than the first optical mode away from the first coupler.

39. The system of claim 32 further comprising (3) an optical element that is optically coupled with the active-material stack.

40. The system of claim 39 wherein the optical element and active-material stack collectively define a laser selected from the group consisting of a distributed feedback (DFB) laser, a distributed Bragg reflector (DBR) laser, and a coupled-cavity laser.

41. The system of claim 39 wherein the optical element is configured as a mirror for partially defining a laser cavity in the active-material stack.

* * * * *